(12) United States Patent
Mayleben et al.

(10) Patent No.: US 12,385,985 B2
(45) Date of Patent: *Aug. 12, 2025

(54) MOTOR LEAKAGE CURRENT DETECTOR, DEVICES USING SAME AND RELATED METHODS

(71) Applicants: Wayne/Scott Fetzer Company, Westlake, OH (US); Grid Connect, Inc., Naperville, IL (US)

(72) Inventors: Philip Anthony Mayleben, Burlington, KY (US); Cristian Codreanu, Chicago, IL (US)

(73) Assignees: Wayne/Scott Fetzer Company, Westlake, OH (US); Grid Connect, Inc., Naperville, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/530,622

(22) Filed: Dec. 6, 2023

(65) Prior Publication Data
US 2024/0168103 A1    May 23, 2024

Related U.S. Application Data

(63) Continuation of application No. 17/219,101, filed on Mar. 31, 2021, now Pat. No. 11,841,403.
(Continued)

(51) Int. Cl.
*G01R 31/52* (2020.01)
*F04B 17/03* (2006.01)
(Continued)

(52) U.S. Cl.
CPC .............. *G01R 31/52* (2020.01); *F04B 17/03* (2013.01); *F04D 15/0077* (2013.01);
(Continued)

(58) Field of Classification Search
CPC ....... G01R 31/52; G01R 31/343; F04B 17/03; F04B 2207/701; F04B 2207/702;
(Continued)

(56) References Cited

U.S. PATENT DOCUMENTS 3,184,671 A    5/1965    Riggs
3,611,036 A   10/1971   Edson
(Continued)

FOREIGN PATENT DOCUMENTS

| CN | 107251185 | 10/2017 |
| CN | 108661898 | 10/2018 |
| WO | 2016105551 | 6/2016 |

OTHER PUBLICATIONS

Blue Angel Pump Company, Blue Angel Catalog, 2018, 34 pp.
(Continued)

*Primary Examiner* — Lisa M Caputo
*Assistant Examiner* — Sharah Zaab
(74) *Attorney, Agent, or Firm* — Arnold & Porter Kaye Scholer LLP

(57) ABSTRACT

A motor leakage current detector and/or a heat compensating circuit, devices using same and related methods are disclosed herein. Included are a uniquely wired current transformer to allow for polarity agnostic leakage current detection, a leakage current detector using same and having a notifier to alert a user. In other forms, an accessory power cord and power strip are disclosed capable of detecting early motor failure conditions. In still other forms, other machinery failure early warning systems are disclosed as are numerous motor operated devices using same including without limitation pumps.

19 Claims, 12 Drawing Sheets

Related U.S. Application Data

(60) Provisional application No. 63/166,131, filed on Mar. 25, 2021, provisional application No. 63/004,356, filed on Apr. 2, 2020.

(51) Int. Cl.
*F04D 15/00* (2006.01)
*G01R 31/34* (2020.01)
*H02P 29/024* (2016.01)

(52) U.S. Cl.
CPC ....... *F04D 15/0088* (2013.01); *G01R 31/343* (2013.01); *H02P 29/027* (2013.01); *F04B 2207/701* (2013.01); *F04B 2207/702* (2013.01); *F05B 2260/80* (2013.01); *F05B 2260/83* (2013.01); *F05B 2270/3032* (2013.01)

(58) Field of Classification Search
CPC ............. F04D 15/0077; F01D 15/0088; H02P 29/027; F05B 2260/80; F05B 2270/3032
See application file for complete search history.

(56) References Cited

U.S. PATENT DOCUMENTS

| | | | |
|---|---|---|---|
| 3,772,569 A | 11/1973 | Wible | |
| 3,857,069 A * | 12/1974 | Howell | H02H 3/331 361/45 |
| 4,540,922 A | 9/1985 | Horvath | |
| 4,608,859 A * | 9/1986 | Rockley | E21B 49/005 73/152.05 |
| 4,716,487 A | 12/1987 | Horvath | |
| 4,901,070 A | 2/1990 | Vandevier | |
| 5,155,441 A * | 10/1992 | Zelm | G01R 31/52 324/765.01 |
| 5,172,289 A | 12/1992 | Zelm | |
| 5,205,725 A | 4/1993 | Pattison | |
| 5,206,572 A | 4/1993 | Farag | |
| 5,243,243 A | 9/1993 | Andrews | |
| 5,345,180 A | 9/1994 | Maier | |
| 5,448,442 A | 9/1995 | Farag | |
| 5,488,320 A | 1/1996 | Carvella | |
| 5,751,132 A | 5/1998 | Horvath | |
| 6,134,126 A | 10/2000 | Ikekame | |
| 6,327,124 B1 | 12/2001 | Fearing | |
| 6,375,430 B1 | 4/2002 | Eckert | |
| 6,443,715 B1 | 9/2002 | Mayleben | |
| 6,593,751 B2 | 7/2003 | Takahashi | |
| 6,593,767 B1 | 7/2003 | Tanaka | |
| 6,676,382 B2 | 1/2004 | Leighton | |
| 7,210,342 B1 * | 5/2007 | Sterner | E21B 21/01 73/152.23 |
| 7,876,539 B2 | 1/2011 | Tharp | |
| 8,380,355 B2 | 2/2013 | Mayleben | |
| 8,958,183 B2 | 2/2015 | Lacey | |
| 9,244,110 B2 | 1/2016 | Ward | |
| D823,345 S | 7/2018 | Wilds | |
| 10,162,008 B2 | 12/2018 | Kinsella | |
| 10,218,168 B2 | 2/2019 | Bangle | |
| D868,117 S | 11/2019 | Mayleben | |
| D875,142 S | 2/2020 | Wilds | |
| D890,211 S | 7/2020 | Cooper | |
| 10,711,788 B2 | 7/2020 | Mayleben | |
| D893,552 S | 8/2020 | Mayleben | |
| D910,719 S | 2/2021 | Cooper | |
| 10,907,638 B2 | 2/2021 | Wilds | |
| D914,060 S | 3/2021 | Cooper | |
| 11,136,983 B2 | 10/2021 | Mayleben et al. | |
| 11,841,403 B2 | 12/2023 | Mayleben et al. | |
| 2004/0257029 A1 | 12/2004 | Sakamoto | |
| 2008/0229819 A1 | 9/2008 | Mayleben | |
| 2009/0256576 A1 * | 10/2009 | Weems, II | G01R 31/52 324/520 |
| 2011/0110792 A1 | 5/2011 | Mauro | |
| 2011/0110794 A1 | 5/2011 | Mayleben | |
| 2012/0112757 A1 * | 5/2012 | Vrankovic | G01R 31/52 324/509 |
| 2013/0156605 A1 | 6/2013 | Mayleben | |
| 2016/0061872 A1 | 3/2016 | Kinsella | |
| 2017/0030371 A1 | 2/2017 | Wilds | |
| 2017/0175746 A1 | 6/2017 | Mayleben | |
| 2018/0128272 A1 | 5/2018 | Mayleben et al. | |
| 2018/0135633 A1 | 5/2018 | Mayleben | |
| 2018/0163730 A1 | 6/2018 | Wilds | |
| 2018/0195383 A1 * | 7/2018 | Smith | E21B 49/02 |
| 2019/0048875 A1 | 2/2019 | Mayleben | |
| 2019/0331725 A1 | 10/2019 | Ikushima | |
| 2020/0003217 A1 | 1/2020 | Wilds | |
| 2020/0182249 A1 | 6/2020 | Mayleben | |
| 2021/0310492 A1 | 10/2021 | Mayleben et al. | |

OTHER PUBLICATIONS

Blue Angel Pump Company, Blue Angel Catalog, Oct. 2015, 39 pp.
Canadian Industrial Design Certificate of Registration No. 182411, "Pump", Registered Sep. 10, 2019.
European Union Community Design Certificate of Registration Nos. 005993672-0001 to 005993672-0002, Registered Jan. 11, 2019.
USPTO; U.S. Appl. No. 17/219,101; Final Rejection mailed Feb. 21, 2023; (pp. 1-35).
USPTO; U.S. Appl. No. 17/494,767; Non-Final Rejection mailed Apr. 28, 2023; (pp. 1-18).
Wayne Water Systems, Wayne Catalog, Oct. 2014, 52 pp.

* cited by examiner

MOTOR LEAKAGE CURRENT DETECTOR, DEVICES USING SAME AND RELATED METHODS

CROSS-REFERENCE TO RELATED APPLICATIONS

This application is a continuation of prior application Ser. No. 17/219,101, filed Mar. 31, 2021, which claims the benefit of U.S. Provisional Application No. 63/004,356, filed Apr. 2, 2020, and U.S. Provisional Application No. 63/166,131, filed Mar. 25, 2021, both of which are all incorporated herein by reference in their entirety.

FIELD

The present disclosure generally relates to an apparatus and methods for detecting a failure condition in an electric motor driven device and/or for addressing heat issues related to circuits, and, more particularly, to apparatus and methods for detecting leakage current in a motor driven device when the motor driven device is not operating and addressing heat dissipation issues in a circuit, and devices using the above, and related methods to same.

BACKGROUND

Electric motor driven devices have been used for many years and have a wide range of applications. Many applications require the motor to turn on automatically and operate when certain conditions are present. Often in these applications, the failure of the motor to operate when the conditions are present has undesirable effects. It thus is desirable to know when a motor is predisposed to or starting to fail, so the undesired effects of a motor failure can be avoided. While there are many different types of motor driven devices and applications where the failure of a motor has undesirable effects, one example is a submersible sump pump. Many homeowners place submersible sump pumps in the sump pits in the basement of their home. When the water level in the sump pit rises to a certain level (e.g., when it rains), the pump will turn on and transport the water to a different location. If the sump pump fails and does not turn on, the homeowner's basement may flood and cause damage to the things in the homeowner's basement such as carpet or drywall. Electric sump pumps are generally powered via an AC power source that plugs into a home's AC power supply (or mains electricity, domestic power, grid power, etc.).

Many common issues of sump pump failure are known, and many improvements have been made to sump pump technology. A common problem among sump pumps is that the mechanical float switch that detects the height of the water corrodes or otherwise breaks down over time and fails. This results in the pump failing to run even when the water level rises beyond the maximum allowable level. Some solutions to this problem have been to use a solid-state fluid level sensor or a pneumatic fluid level sensor rather than a mechanical float. This reduces the number of mechanical parts that are exposed to water that cause the mechanical floats to fail. Indeed, float switch failure is the most common problem associated with sump pumps and reason for their failure, however, there are other problems that can occur that are harder to detect.

The next leading problem for pumps is motor failure caused by difficult to detect problems such as compromised insulation systems and/or water intrusion into the pump. These may be due to problems with the potting material used to encase the motor and waterproof it, or due to cracks in the motor housing, etc. For example, water intrusion can be caused by the failure of a seal which allows water to leak into the motor cavity. Once water gets to the motor cavity, the insulation around the motor windings begin to gradually deteriorate causing a variety of electrical problems for the motor, such as a short circuit or ground fault. While the pump may continue to run for some period of time, once water gets into the motor, the motor of the pump will likely fail in the near future. These types of problems are not currently detected until the pump fails which is too late, particularly if the failure occurs when the pump is needed most in a storm or flood condition.

Before discussing how the leakage current detector operates, the cause of the existence of leakage current will first be explained. Motors have windings that are encased in insulation. The insulation may be made of any material that is non-conducting, including non-conducting varnishes. This provides an insulative barrier between the motor windings and the motor housing or the cavity walls in which the motor is placed in. The insulative barrier prevents the motor windings from short circuiting across the windings or from leaking current to ground through the motor housing or other components that the motor may be near. Once in contact with water, the motor insulation degrades and deteriorates. This allows current to flow through or leak out of the motor through the degraded portion of the motor insulation. This can not only result in dangerous conditions, but also indicates that the motor will no longer operate properly once the degradation of the motor winding insulation has progressed further. The motor insulation may degrade due to age or other environmental conditions, not just due to contact with water. Thus, it has become important to know when this failure or degradation occurs so that action may be taken to prevent motor failure at an inopportune time.

Similarly, motors are often encased in epoxy resin to waterproof the housing and/or protect electronics therein. This resin can breakdown over time as well and cause some of the same problems as those discussed immediately above. Thus, having the ability to detect motor leakage current and to monitor other features of the motor as will be discussed herein are very important and useful to detect issues in advance of them becoming major problems so that they can be reported to a user prior to any damage being done.

Systems to detect leakage current exist, however, many systems require the motor to be running for leakage current to be detected. This is problematic in applications where a motor is only running when certain conditions are present, e.g., when water reaches a certain level. Using many of the existing leakage current detection systems, it could only be discovered that a motor exhibits failure conditions once the conditions requiring the motor to operate are present, which is often too late.

Another limitation of existing leakage current detection system is that the system must know with certainty which conductor is the Neutral and which is the Line or Hot conductor. Standard electrical outlets in the U.S. are designed to provide this information, with code defining that the big prong receptacle on an electrical outlet is Neutral and the small prong receptacle is Line. Normally code also requires the wiring to be color coded (e.g., line/hot is black wire, neutral is white wire, ground wire is plain copper wire, etc.). Unfortunately, in many homes and buildings in the United States, care has not been taken to ensure that the electrical outlets are wired properly (e.g., sometimes wires are hooked to wrong prongs, sometimes a white wire is marked with electrical tape to indicate it is being used as a line/hot wire instead of neutral, etc.). Thus, when using many of the existing leakage current detection systems with electrical outlets that are wired backward, leakage current is not able to be detected. This results in motors not being identified as exhibiting motor failure conditions, ultimately resulting in an unexpected motor failure.

Another problem with conventional circuits is their inability to address or dissipate heat in circuits, particularly those having an alternating current ("AC") switch. In some devices, thermal cutoff switches are used to prevent a circuit from overheating and/or doing damage to the circuitry (or one or more components of the circuitry). This interrupts use of the circuit or device associated with same which is not desirable. In alternate forms, large heatsinks are used to address the heat, but these can be expensive and/or require valuable space to be taken-up with the heatsink.

BRIEF DESCRIPTION OF THE DRAWINGS

Described herein are embodiments of systems, methods and apparatus for addressing shortcomings of known sump pumps.

This description includes drawings, wherein.

Figure 1:
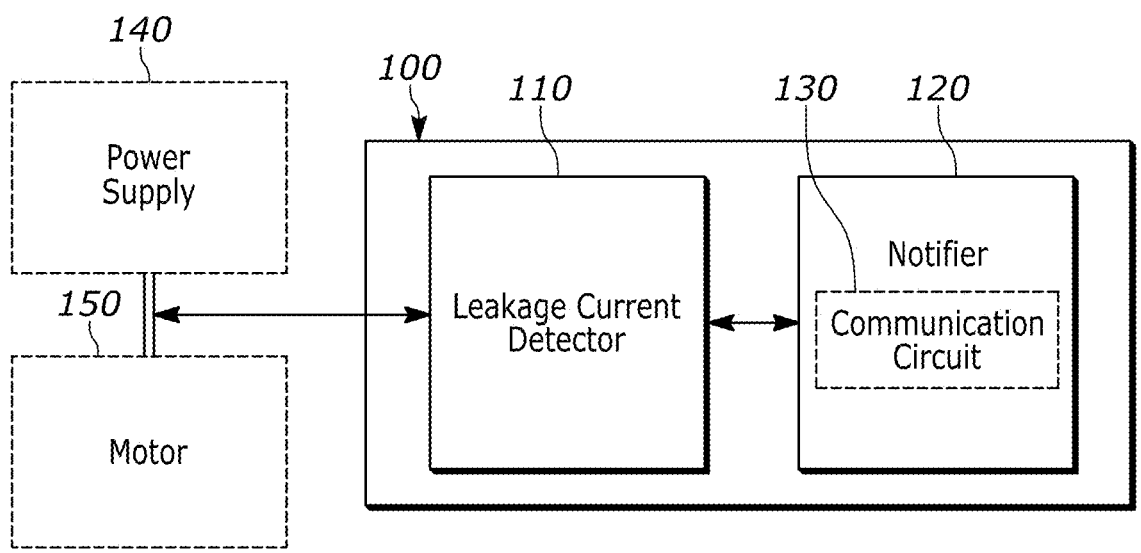
FIG. 1 is an exemplary block diagram for a leakage current detector in according with aspects of the invention.

Corresponding reference characters in the attached drawings indicate corresponding components throughout the several views of the drawings. In addition, elements in the figures are illustrated for simplicity and clarity and have not necessarily been drawn to scale. For example, the dimensions of some of the elements in the figures may be exaggerated relative to other elements to help to improve understanding of various embodiments. Also, common but well-understood elements that are useful or necessary in a commercially feasible embodiment are often not depicted or described in order to facilitate a less obstructed view of the illustrated elements and a more concise disclosure.

DETAILED DESCRIPTION

This disclosure is directed to various apparatuses, systems, and methods for leakage current detection and applications of same including without limitation an apparatus or device that detects whether leakage current in an electric motor, which may indicate to a motor operator that the motor exhibits conditions indicating the motor is predisposed to or starting to show signs it is going to fail. The devices, systems and methods disclosed herein are for identifying when a failure condition is present in a device, such as an electric motor driven/operated device, and notifying a user of the failure condition. The identified failure conditions may even be further analyzed and categorized as indicating that failure is imminent or that failure conditions are present, but immediate failure is not likely. In preferred forms, the apparatuses, systems and methods disclosed herein can conduct the leakage current detection test while the device is not in operation and provide early warning as to motor failure issues well in advance of a motor failure actually happening.

The devices, systems and methods of this disclosure may come in many forms. For example, in FIG. 1 a block diagram of an exemplary embodiment is illustrated and referenced generally as smart controller 100 and includes a leakage current detector 110 and notifier 120 for indicating to the user a resultant of the test conducted by the smart controller 100. The smart controller 100 is connected between a power supply 140 (e.g., domestic power supply, grid power, mains electricity, etc.) and a motor 150.

In a preferred form, the notifier will be one of a visual and/or audible device for alerting the user as to an outcome of a test conducted by the smart controller. The alerting may occur only if the leakage current detector 110 indicates early motor failure is detected, but in other preferred instances it may be configured to always provide a response (e.g., providing an alert of a first type if the motor has passed the test conducted by the smart controller 100 and an alert of a second type different than the first if the motor has not passed the test). For example, in a preferred form, the smart controller 100 will include a light or series of lights that provide a green light when the motor has passed the test, a yellow light when early signs of motor failure are detected and a red light when signs of urgent or imminent motor failure are detected. This can be accomplished in one multi-colored LED or it can entail using separate LEDs if desired. In other forms a more comprehensive display, such as a digital display, may be provided that provides additional information (e.g., text, images or symbols, etc.) regarding test results of the smart controller 100.

As mentioned above, the smart controller 100 may include an audible notifier 120 either in addition to the visual display or instead of the visual display. In a preferred form, the smart controller 100 will include both audible and visual devices for communicating test results of smart controller 100 to the user. In the form show, the audible sound is generated by a buzzer or speaker and may be configured to provide one sound, such as a chirp, to acknowledge the depressing of inputs and another sound, such as a longer and repeated beep or constant sound when either an early motor failure condition is detected, or an imminent motor failure condition is detected by smart controller 100. In one form, the smart controller will chirp when an early motor failure condition is detected but change to a constant audible alert when a more urgent motor failure condition is detected.

In the form shown in FIG. 1, the notifier 120 of smart controller 100 may also include a communication circuit 130 for sending alerts or test results from smart controller 100 to a user that is located remote from the smart controller 100. In some forms, this may be a wireless communication module that alerts the user via a local area network (LAN) or wide area network (WAN). In a preferred form, the communication module 130 will be a Wi-Fi enabled circuit that communicates the test results to the remote user via a Wi-Fi network the smart controller 100 is connected to so that the user may get the alerts on a mobile device, such as a smart phone. In alternate embodiments other forms of wireless communication may be utilized such as radio frequency (RF), infrared (IR), Bluetooth (BT), Bluetooth Low Energy (BLE), Near Field Communication (NFC), cellular, etc. While the preferred message will be in the form of text or graphics and text, in other forms an audio recorded message may be utilized as well (or instead of the text) advising of the test results.

In a preferred form, the smart controller 100 is utilized with a software application (App) and is capable of monitoring voltage (V), current (A), current leakage to ground (leakage current) and phase angle. The device 100 via a processor (e.g., either onboard or remote via the cloud, etc.) can process the data to operate like an oscilloscope capturing both waveforms as well as phase angle between them. By knowing and recording the V, A, leakage current and phase angle, the smart controller 100 will be capable of detecting any of the motor driven device's parameters has fallen outside of normal levels. For example, a change in phase angle could indicate an issue with the motor's capacitor meaning the motor capacitor may need to be replaced. Unusual current may indicate the motor bearing is worn or rubbing and needs attention, or that an obstruction is present and needs to be cleared. Leakage current will indicate motor issues like those discussed herein (e.g., insulation breakdown, infiltration of fluid, etc.). Unusual voltage input can also be detected to alert of unstable conditions (e.g., poor power source or power cord, surge, etc.).

Figure 2:
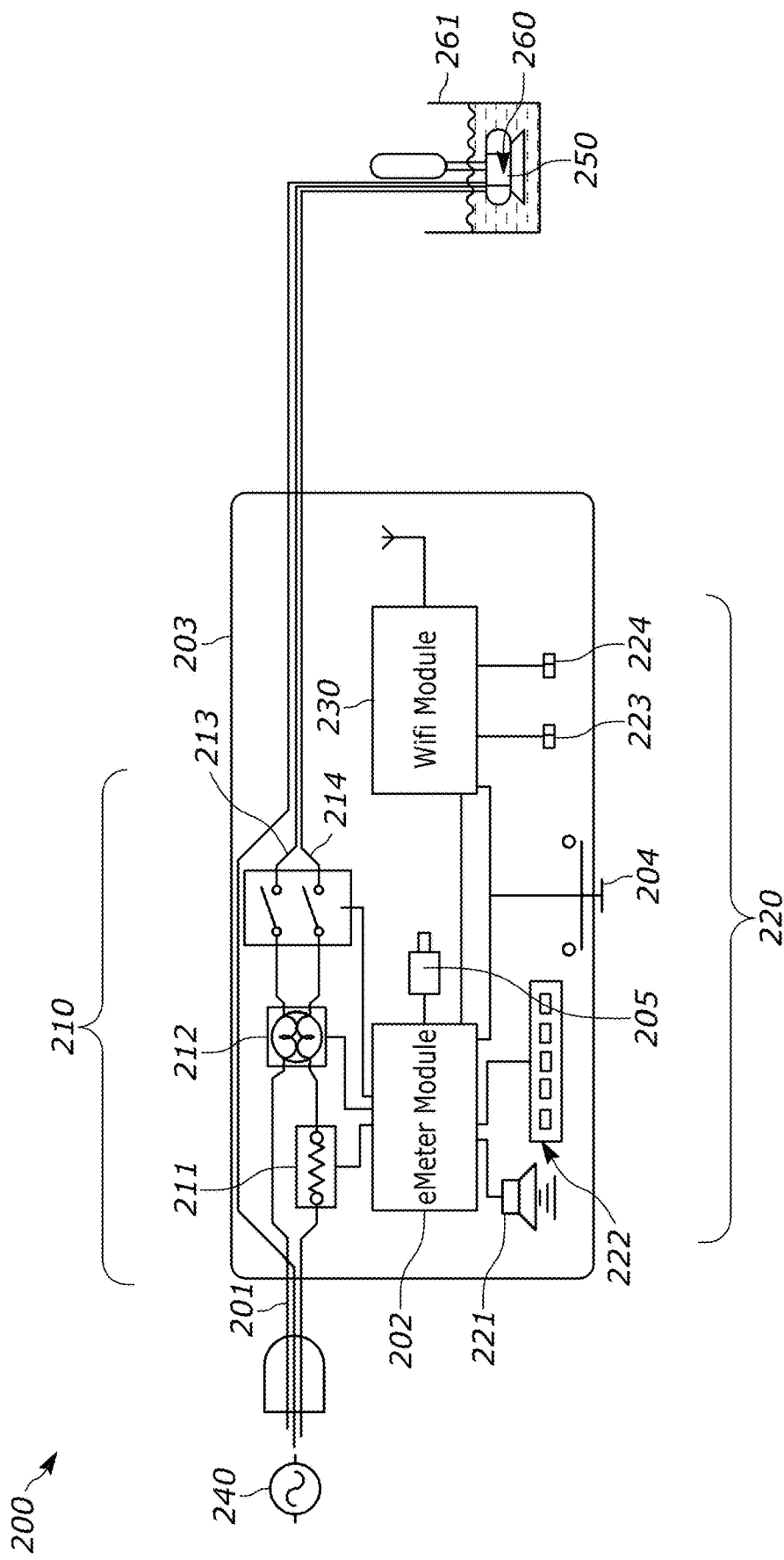
FIG. 2 is an exemplary circuit diagram for a leakage current detector used in connection with a pump.

In FIG. 2, an exemplary circuit is shown for smart control 100. For convenience, items in this embodiment that are similar to those discussed in FIG. 1 will utilize the same latter two-digit reference numeral but the prefix 2 instead of 1. Thus, the smart control of FIG. 2 is referred to generally by reference numeral 200 (instead of 100 as was used in FIG. 1), power supply 240 (instead of 140) and motor 250 (instead of 150). In the circuit of FIG. 2, the smart control 200 is connected between the power supply 240 and motor 250 of a sump pump 260 located in a sump 261. The smart control 200 is connected to power supply 208 via power cord 201 which in turn is connected to a power resister, such as shunt resistor 211, a current transformer 212 and triacs 213, 214 which collectively serve as part of the leakage current detector 210. The smart control 200 further includes a controller 202 connected to an audible alarm 221, visual display, such as water level LEDs 222 and pump status LED 223 and Wi-Fi status LED 224, and communication circuit, such as Wi-Fi module 230. Collectively the audible alarm 221, LEDs 222, 223 and 224, and communication circuit 230 serve as part of the notifier 220. Water level LEDs 222 illuminate to represent how high the fluid level is in sump 261 (e.g., illuminating more LEDs as the water level rises). Preferably, multiple colors will be used to draw the user's attention to the fluid level LEDs 222 when the fluid level is getting critically high or too high representing a potential flooding condition. For example, in a preferred form, of the five LEDs show, at least the fifth LED will illuminate in red while the others illuminate in another color (e.g., blue, green, yellow, etc.) in order to indicate that the water level is critically high. In some forms, multiple colored LEDs will be used such as green or blue for low fluid level, yellow for intermediate fluid levels and red for high fluid level.

Pump status LED 223 illustrates if the pump is operating correctly and in a preferred form will include a multi-color LED capable of glowing green to indicate the pump is ok, glowing yellow to indicate the pump has some problem with it (e.g., early motor failure conditions have been detected, or any other anomaly with the pump such as an unusual current or voltage draw possibly indicating an obstructed impeller, etc.) and glowing red to indicate the pump is not working correctly (e.g., an urgent motor failure condition has been detected by the testing of smart control 200, or any other anomaly with the pump such as a thermal cut-off (TCO) switch has been triggered, extremely high or low voltages or currents detected, etc.). Wi-Fi status LED 224 illustrates if the smart control 200 is connected to Wi-Fi and/or the strength of that signal. In a preferred form Wi-Fi status LED 224 will be a multi-color LED capable of glowing green when the smart control 200 is connected to Wi-Fi and the signal strength is good, will glow yellow if the smart control 200 is connected to Wi-Fi but the signal is weak, and will glow red if the smart control 200 is not connected to Wi-Fi. It should be understood, that multi-color LEDs may be replaced by multiple single-color LEDs if desired and/or that the smart control 200 could alternatively be setup only to illuminate an LED when an error condition is detected (e.g., only illuminate a fluid level LED to indicate the fluid level is too high, only illuminate a pump status LED when the pump is not working or an imminent motor failure condition has been detected, only illuminate a Wi-Fi status LED to indicate the smart control 200 is not connected to Wi-Fi, etc.).

As shown in FIG. 2, the smart control 200 includes an enclosure, such as housing 203 and utilizes a user input 204 to allow the user to interact with the smart control 200. In a preferred form, the user input 204 is a multi-purpose or multi-function button that allows the user to manually initiate the smart control 200 to test the pump motor 250 of sump pump 260. The input 204 may also be used by a user to mute the audible alarm 221 if it is activated. The input 204 may further be used to sync the smart control 200 to a local Wi-Fi network. In a preferred form, the smart control 200 will be setup via the user downloading an app from a software application store (e.g., Apple's App Store, Google Play, etc.) and the user will use the app and the multi-function input 204 to connect the smart control 200 to the local Wi-Fi and check the status of the smart control 200 remotely. In the form shown, the smart control 200 further includes a pressure transducer 205 for operating as the pneumatic or air switch for detecting fluid level in sump 261. As will be discussed in later embodiments, the pressure transducer will be connected to an air chamber or housing via tubing to determine pressure changes that reflect changes in the fluid level of sump 261.

In operation, smart controller 200 is capable of performing a leakage current detection test while the motor 250 is not being operated because of the uniquely configured circuitry. As mentioned, this has the added benefit of reducing or minimizing background noise or interference that the operation of the motor would cause. The controller 202 uses triacs 213, 214 to open one triac and thus power line (e.g., hot or neutral) and see if there is leakage to ground and then close that triac and open the other triac and power line (e.g., neutral or hot depending on which was opened via the initial triac) to see if there is any leakage to ground. If leakage to ground is detected, the smart control 200 will determine how critical the condition is and determine how to notify the user of same. In a preferred form, if the leakage detected is 0.05 mA to 0.1 mA, the smart control 200 will send an alert to the user via communication circuit 230 and change the pump status LED 223 to yellow. However, if the leakage detected is greater than 0.1 mA, the smart control 200 will not only send the user an alert via communication circuit 230, but it will also trigger the audible alarm 221 and change the pump status LED 223 to red indicating a more urgent motor failure condition is present. These leakage current thresholds/ranges are exemplary and may be adjusted as desired for a particular motor operated device or application as desired.

Figure 3:
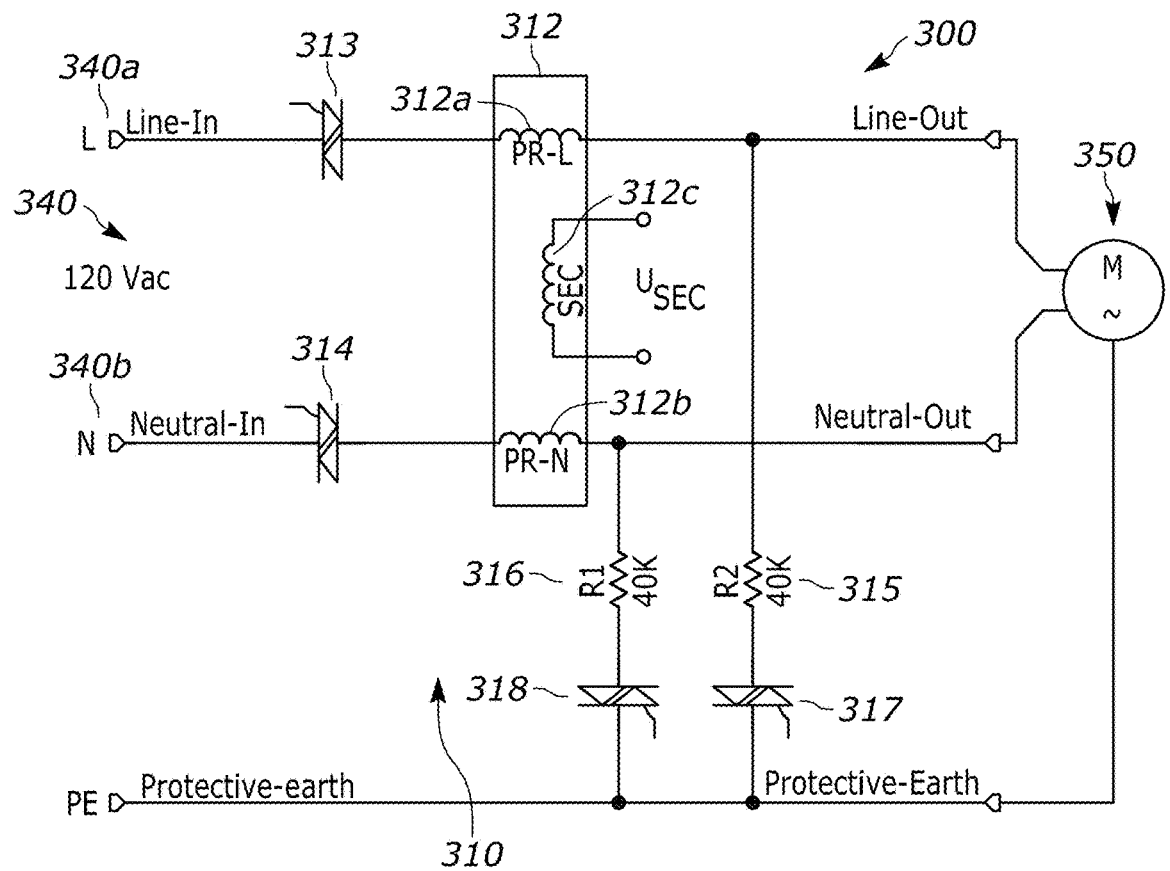
FIG. 3 is an alternate exemplary circuit diagram for a leakage current detector in accordance with aspects of the invention.

As mentioned above, the inventions disclosed herein may be implemented in numerous different embodiments. As an example, an alternate more simplistic circuit is illustrated in FIG. 3 for the smart control. In keeping with prior practice, items that are similar to those discussed above will use the same latter two-digit reference numeral but begin with the prefix 3 to distinguish this embodiment form other embodiments. Thus, in FIG. 3, the smart control is referenced generally by reference numeral 300 which is connected between power supply 340 and motor 350. In this form, first and second triacs, 313, 314 respectively, are again in front of transformer 312, but the circuit also includes additional resister or switch pairs 315, 317 and 316, 318 located behind transformer 312. This circuit operates similarly to that of FIG. 2, but lacks some of the functionality and additional features associated with the notifier/communication circuit, etc. In particular, isolation transformer 312 is a dual primary current transformer with triac 313 connecting the first primary coil (or Primary L (PR-L)) 312a to line or hot 340a and triac 314 connecting the second primary coil (or Primary N (PR-N)) 312b to neutral 340b. Again, that is assuming the wiring of the outlet the circuit is connected to is wired correctly. In operation the secondary coil (or SEC.) 312c is used with each coil 312a, 312b to conduct the leakage current detection test. First triac 313 is opened to test leakage current on neutral wire/line 340b and second triac 314 is opened to test leakage current on the line/hot wire/line 340a. This allows the leakage current detection test to be conducted without the need to have motor 350 operating. A benefit of this is that there is reduced or minimal background noise or interference when doing the test because the motor is not running. Not shown in the circuit is an audible alarm device (e.g., buzzer, speaker, horn, etc.), input for user interface and pressure transducer.

In looking at the leakage current detector of the circuit of FIG. 3 more closely, the connection between the leakage current detector 310 and the electrical power supply lines of the motor 350 may be in the form of a transformer 312 placed in proximity to the Line wire and Neutral wire that collectively power the motor 220. The transformer 312 may include a first primary coil 312a, a second primary coil 312b, and one secondary coil 312c. The first primary coil 312a is what should be the Line conductor wound into a coil and the second primary coil 312b, which is the Neutral conductor, wound into a coil. While it should only be necessary for the Line conductor to be the only primary coil, both the Line and Neutral conductors, are used as primary coils, because it cannot be known with certainty whether the electrical outlet the motor has been plugged into was wired correctly, i.e., that the Line is wired to the small prong receptacle and the Neutral is wired to the large prong receptacle. Using two primary coils allows the leakage current detector 310 to be indifferent to which power supply conductor is Line or Neutral (e.g., polarity agnostic). The secondary coil 312c is in close proximity to the first and second primary coils 312a, 312b so that current flowing in either the first or second primary coil 312a, 312b induces current flow in the secondary coil 312c. The secondary coil 312c has leads on either end of the coil that connect to the rest of the leakage current detection circuit 310.

The leakage current detector 310 is capable of detecting small currents, specifically, currents below those which a ground fault circuit interrupter (GFCI) or ground fault interrupter (GFI) will detect and interrupt the circuit. Many GFCI/GFI devices will not allow current to flow to a device when the leakage to ground is greater than 6 mA. The leakage current detector 310 may be designed and configured to detect current flow below that which a GFCI/GFI will interrupt the circuit, to detect the early signs of motor failure, before the leakage current gets above 6 mA. It should be understood that in other regions of the world GFCI/GFI are referred to as residual-current devices (RCD) or residual-current circuit breakers (RCCB).

The Line and Neutral conductors (or wires) may be connected to the Line and Neutral terminals of an electric outlet, through a power cord. The leakage current detection circuitry 310 further includes a first switch 313 on the first conductor and a second switch 314 on the second conductor. These switches 313, 314 are controlled by the leakage current detection circuitry 310 and allow the leakage current detection circuitry 310 to control whether each conductor is open or closed. These switches 313, 314 may be switched to open or closed independently of each other.

The leakage current detector 310 may test the condition of the motor 350 at set intervals. The condition of the motor 350 may also be detected by the leakage current detector 310 at any period of time or when prompted to do so (such as by the user requesting such through an App or via actuation of a physical button (like input 204). In one example, the leakage current detector 310 performs its test periodically, for example, once a week, every 24 hours, every hour, every minute, every 30 seconds, every second, etc., although other periods of time are contemplated. In another example, the leakage current detector 310 is configured to test the motor 350 when another system of the motor driven device performs a diagnostic test. The leakage current detector 310 may be configured to automatically perform a test on the motor 350 when the motor (or in the preferred case pump) is connected to a power supply 340, e.g., when plugged into an outlet or power is restored.

In one embodiment, the leakage current detector 310 is configured to test the motor 350 immediately before the motor 350 is commanded to run. This could be in pump applications, for example, when water rises above a predetermined level. This may be done to ensure the GFCI/GFI will not trip and interrupt the circuit.

In another embodiment, the motor or pump system includes a push-button like input 204 in the circuit of FIG. 2, which can be pressed, for example, by a user to run the leakage current detection test. The push-button may also be used for any other test the system may be configured to run, for example, the push-button or another push-button may be pressed to determine whether the battery is sufficiently charged. The push-button can also be used for one or more other functions, including, for example, to silence an alarm, deactivate a notification, re-set warning signals, start a test cycle, or the like.

As mentioned, one benefit of the leakage current detector disclosed herein (e.g., 110, 210, 310, etc.) is that the motor does not have to be running to do the test. Another benefit is that it is configured to be polarity agnostic so that it can make-up for situations where the wiring of the electrical socket the motor is connected to was not done correctly. To use such a tool, the motor need only be connected to the power source and then, without needing to operate the motor, the leakage current detector can test the circuit to see if there are signs of motor failure (e.g., motor insulation breakdown, fluid breach into the motor, etc.). For example, in FIG. 3, the electric motor driven device and motor 350 are connected to the power supply 340. The leakage current detector 310 receives a signal to test for leakage. This may be a signal prompted by the passing of a certain amount of time or initiated by the user as discussed above. The leakage current detector 310 then closes switch 313 and opens switch 314. This allows electricity to freely flow over the closed first switch 313 and to the Line conductor. If the insulation of the motor 350 is still in good condition, there is no leakage current and no current will flow because the second switch 314 is open and the circuit is not complete. If the insulation of the motor has degraded or deteriorated to the point it has a low resistance through which current may flow, current will leak to the ground through the motor's insulation. This means that current will be flowing in the conductor coupled to the first switch. If the first switch 313 is connected to the Neutral conductor instead of Line conductor (not what is shown in the circuit of FIG. 3 but possible due to improper wiring in the outlet), then no current will flow regardless of the condition of the insulation of the motor. The leakage current detection circuitry 310 measures the amount of current that is flowing and may even record this amount.

After measuring and recording the current flow, the leakage current detection circuitry 310 then opens the first switch 313 and closes the second switch 314. The leakage current detection circuit 310 then measures and, if desired, records the flow of current. If the second switch 314 connects to the Line conductor (instead of Neutral conductor because of improper wiring), then current will flow if the insulation of the motor had degraded such that it has low enough resistance for current to flow to ground. The leakage current detection circuit 310 then determines whether the current flowing in the first or second test was an acceptable amount. Some current may flow when the motor 350 is connected to the Line conductor even if the motor insulation is in good condition. This can be because the motor insulation resistance is not infinite, so some current will flow through the insulation to ground. Small amounts of this leakage current may be acceptable, and not indicate any immediate concern of the condition of the motor 350. If the current flowing was greater than an acceptable amount, the leakage current detection circuitry 310 may communicate this to a notifier circuit (not shown but see 120 and 220). In another example, the leakage current detection circuit 310 communicates the amount of current flow detected to another circuit, such as the notifier circuit, which will then determine if the amount of current flow is not acceptable.

In a preferred form, the circuit of FIG. 3 would also include a notifier such as that discussed with respect to FIG. 2. In a preferred form, the notifier would provide a user with an alert when a failure condition has been detected in the one or more devices plugged into the accessory or, in instances where the smart controller is integrated into an OEM product, the single device itself. The notifier is a notification system to alert a user or another portion of the system that a leakage current has been detected or that some other fault has been detected with respect to the pump (e.g., anomaly relating to current draw, voltage draw, phase shift, etc.). The notifier circuit may be a separate circuit or a portion of the leakage current detector 310. The notifier may be configured to alert a user in response to a determination by the motor leakage current detector 310 that a leakage amount greater than a predetermined amount has been detected, for example, greater than 0.05 mA. For example, the notifier may alert a user when an impermissible leakage current is detected by sending an alert to notify the user or operator. To alert the user when leakage current has been detected, there may be a light or multiple lights disposed on the top surface of the smart controller that light up when a failure condition has been detected. In another example, there are two lights, each being a different color. The lights may be LEDs and may even be a single multi-colored LED. The first color light may be configured to illuminate when a failure condition is present, for example, the leakage current detection circuit 310 detected a current flow of 0.01-0.05 mA. The second color light may be configured to illuminate when an imminent motor failure condition has been detected, for example, when a leakage current in the range of 0.05-0.6 mA has been detected. The smart controller may also include an audible device, such as a speaker or a buzzer, to alert the user to either of the two conditions, for example, by a sound such as a beeping or alarm noise. The speaker or buzzer may be used in combination with a light illuminating to alert users to a failure condition or may be used by itself.

In another example, the notifier includes communication circuitry like 130 discussed above in FIG. 1 configured to transmit a notification to a user. This may be performed using, as examples, one or more of wireless fidelity (Wi-Fi), Cellular, radio frequency (RF), infrared (IR), Bluetooth (BT), Bluetooth Low Energy (BLE), Zigbee and near field communication (NFC). Other wireless protocols may also be used. In one example the alert produced by the notifier is transmitted to a display screen viewable by an operator. This may be, as example, a computer or smartphone screen.

The notifier may be configured to use more than one method of communication to a user. In one embodiment, the wireless communication circuitry is configured to communicate via an internet connection as the primary way of notifying a user of a failure condition, but, if the internet connection is not available, the communication circuitry may be configured to communicate via a direct wireless connection, such as NFC as an example. In another embodiment, the notifier both sounds an alarm through a speaker and sends a notification to a user's smartphone through the internet over Wi-Fi when a failure condition has been detected.

The notifier may be configured to categorize the degree of the motor failure condition. For example, the notifier may send an alert when it detects the leakage current is within a certain range, for example, less than 0.05 milliamps and configured to send an alarm when the current is detected to be between 0.05 milliamps and 6 milliamps. The alert would notify a user when a motor failure condition exists that does not require immediate attention, and the alarm would notify a user that an imminent motor failure condition exists upon hearing or seeing the notifier alarm. As examples, the alert may be a flashing LED, while the alarm may be an alarm sound playing through a speaker.

The categorization of the degree of seriousness of the motor failure condition may be determined at least based in part on the amount of leakage current flow. The amount of leakage current can be used to categorize the leakage current to mean either a failure condition is present, or a failure is imminent. In a preferred form, the audible device will be a piezo alarm that goes off when a certain or first leakage current threshold is met or exceeded. For example, if the leakage current detected is below 0.1 mA the piezo buzzer or alarm may chirp at a consistent interval to alert the user to the condition. If the leakage current detected exceeds a second threshold (e.g., over 0.1 mA) the chirp may get louder and/or more frequent or may even become a constant sound to alert the user more urgently. In other forms, the audible device may be configured to actuate only after a period of time has passed since the fault or error condition was first detected and reported. For example, the system may be configured to alert the user via the App initially and then use the audible device to escalate the matter by sounding an alarm after a period of time has expired since the first notice without any corrective action or measures being taken.

Figure 4A:
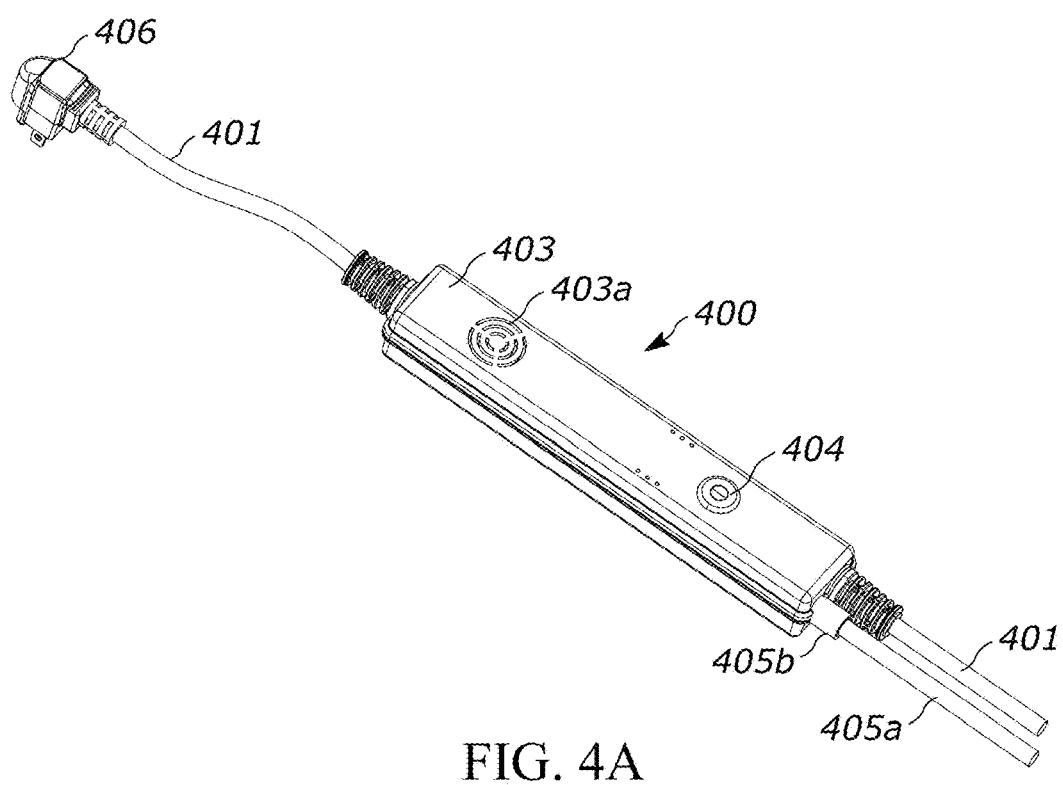
FIGS. 4A-C are top perspective, bottom perspective, and partial cutaway views, respectively, of a smart power cord assembly in accordance with aspects of the invention illustrating the power cord with one half of the housing removed in FIG. 1C to show internal components.
Figure 4B:
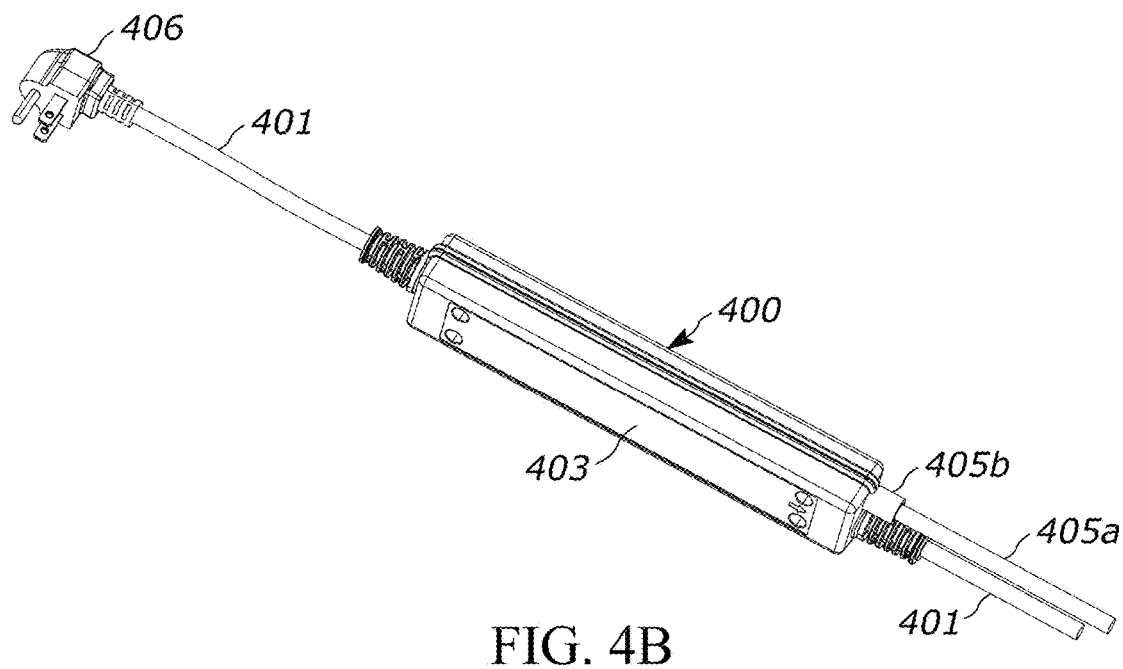
Figure 4C:
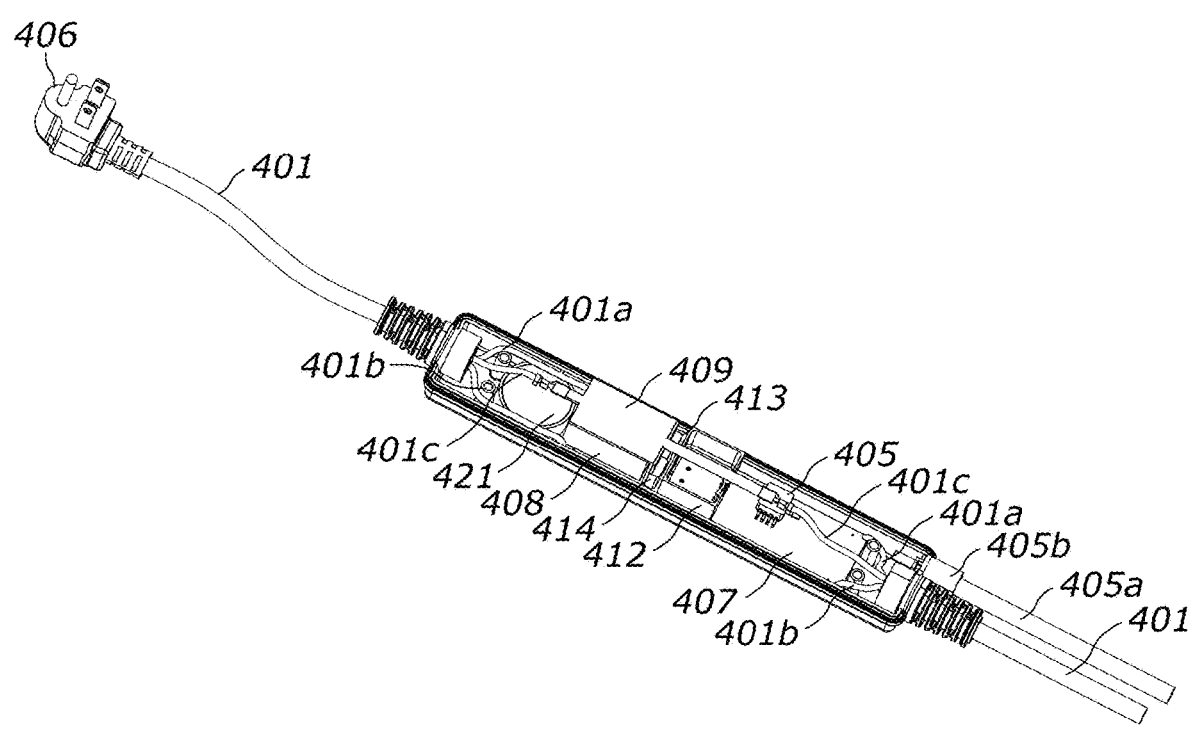

In FIGS. 4A-C, a smart power cord is shown with the smart control circuit illustrated in FIG. 3 above (meaning it is a more simplistic version). In keeping with prior practice, features of this embodiment that are similar to those discussed above will include the same latter two-digit reference numerals, but use the prefix 4 to distinguish this embodiment from others. Thus, the power cord is referenced general as power cord 401 and smart control 400. The smart control 400 of power cord 401 has an enclosure or body 403, and the power cord 401 has an electrical plug 406 to connect the power cord 401 to a power supply (obviously the plug types will differ depending on the region of the world this power cord 401 will be used). The enclosure or body 403 includes a speaker opening 403a and has a user input 404 for allowing the user to interact with the smart control 400. The power cord continues on from the smart control 400 to the motor (not shown) on the opposite side of smart control housing 403 as the plug 406 is on, along with an air tube 405a which is connected to the pressure transducer (not visible).

As can best be seen in FIG. 4C, the body or enclosure 403 encloses a circuit board 407 containing the audible device 421, power circuitry 408 which drops the AC power down to DC for use by smart control 400, current transformer 412, pressure transducer 405, first triac 413 and second triac 414 and heatsink 409 which is connected to the power circuitry 408 and triacs 413, 414 and, in a preferred form, also serves as the earth ground for a portion of the circuit. Thus, the line/hot wire 401a and neutral wire 401b of electrical power cord 401 come in from the plug end 406 of the power cord 401 and connect to the printed circuit board (PCB) 407, then are connected to the power circuitry 408, transformer 412 and exit the PCB 407 at an opposite end thereof. The ground wire 401c comes in and connects to one end of heatsink 409 and exits the opposite end of the heatsink 409 before exiting the housing/enclosure 403 and back into the power cord 401. The pressure transducer tubing or air tube 405a may connect to pressure transducer 405 and exit the house adjacent or proximate the power cord 401 and, preferably, substantially or generally parallel thereto. In the form shown, the smart controller housing or enclosure 403 includes a receiver sleeve 405b to align the air tube 405a passing through the enclosure 403. In a preferred form, the receiver sleeve 405b will actually serve a strain relief role hindering the air tubing 405a from being pulled out of the smart controller 400 or disconnecting from transducer 405. In alternate forms, however, it should be understood that the air tube receiver 405b could alternatively be a tube coupling that allows a segment of air tubing to be connected between the transducer 405 to the coupling and another segment of air tubing to be connected externally to the smart control from the external portion of the coupling to the air tube housing located on the pump.

While FIGS. 4A-C illustrate the smart power cord 401, it should be understood that this power cord could be sold as an accessory to connect to existing electrical motor driven products to detect early motor failure via leakage current detection. Alternatively, the smart power cord 401 may be a permanent or integrated feature included on the power cord of the motor driven devices, for example, manufactured as part of the power cord from the factory (instead of as a standalone component or accessory, that may be attached by a user to their motor driven device).

Figure 5A:
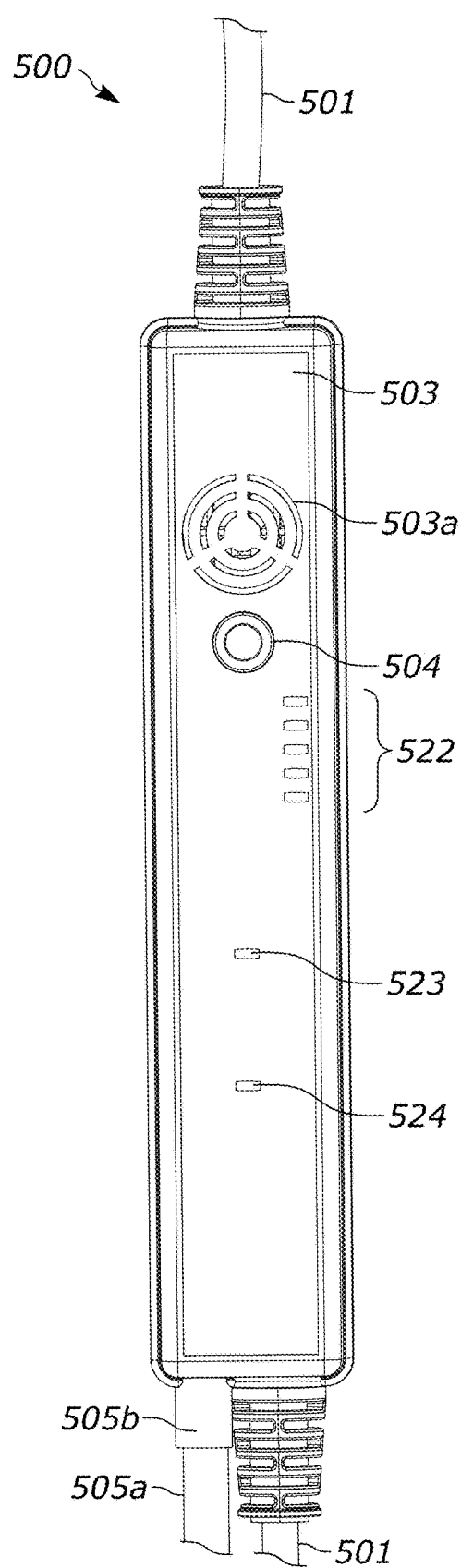
FIGS. 5A-B are top plan views of an alternate smart power cord in accordance with the invention illustrating the housing in FIG. 5A and illustrating the housing with a detailed overlay applied thereto in FIG. 5B.
Figure 5B:
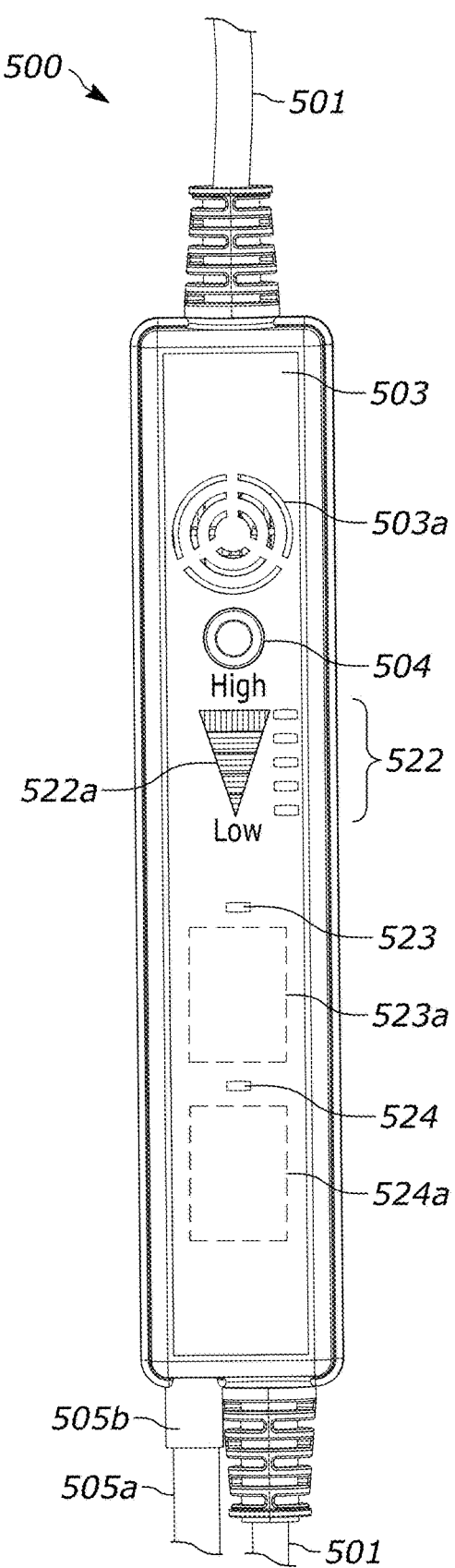

In FIGS. 5A-B, an alternate form of the smart power cord is illustrated that is configured for the circuit discussed above in FIG. 2. In keeping with prior practice, features of this embodiment that are common to earlier ones will use the same latter two-digit reference numeral but use the prefix 5 to distinguish this embodiment from others. Thus, the smart power cord is referred to general by reference numeral 501 and includes smart control 500. The power cord 501 enters the power control housing or enclosure 503 on one end and exits on another and preferably opposite end with the air tube 505a positioned proximate to the exiting portion of the power cord 501. The housing or enclosure 503 includes an audible device opening, such as buzzer, speaker or horning opening 503a. Unlike the prior embodiment of FIGS. 4A-C, however, the embodiment of FIGS. 5A-B has the user input 504 positioned proximate the audible device opening 503. Below that (as illustrated in FIGS. 5A-B), is located the fluid level LEDs 522. In the form shown, those LEDs 522 are positioned off to a side of housing 503 so that a graphical overlay 522a can be placed showing what the water level LEDs 522 are indicating as illustrated in FIG. 5B. As shown, the graphical overlay 522a displays an inverted pyramid indicating the detected water level. As the water level rises, the LEDs associated with a level indicated by the graphical overlay 522a may light up. For example, when the water level is low, only the lowest LED is lit. As the water level increases, the LEDs may sequentially light up until the water level is high, at which point the uppermost LED illuminates. The LEDs 522 may be multi-color LEDs that illuminate a color indicating a severity associated with the detected water level. As one example, if the water level is low, the LEDs that are lit may be green. When the water level is high, the LEDs may be red and may be flashing to indicate to the user that the water level is high. When the water level is in between low and high levels the LEDs may be yellow or orange as examples. In one form, the LEDs are configured to illuminate only a single color. For example, the uppermost LED associated with a high water level may illuminate red when lit. The lower LEDs may illuminate a color indicating a lower level of severity such as blue or green.

Next, the pump status LED 523 is positioned preferably centered on the housing and with room for graphical information 523a below or above the LED 523 as illustrated in FIG. 5B. As one example, the graphical information may display "Pump Status," "Green—OK", Yellow—Failing,"

and "Red—Replace." The pump status LED 523 may accordingly be a multi-color LED configured to illuminate a certain color to indicate to the user the status of the pump. The pump status may be determined by evaluating and weighing a plurality of inputs. For example, the pump status may be based on one or more of a water level, elapsed time, pump run time, current draw, supply voltage, inrush current, power factor, and detected amount of leakage current. The smart power cord processes the data and presents a status of the pump based on one or more measured conditions to provide the end user with a simple indication of the status of their pump. In some forms, the smart power cord may communicate the data to a remote processing device such as a server computer for processing and a determination of the pump status. The smart power cord may receive the pump status from the remote processing device and display the pump status via the pump status LED 523 to the end user.

The Wi-Fi status LED 524 is located next and preferably centered with room to provide graphical information 524a below or above as well (like illustrated in FIG. 5B). As one example, the graphical information 524a may display "Wi-Fi Status," "Green—OK," "Yellow—Connecting," and "Red—No Connection." The Wi-Fi status LED 524 may accordingly be a multi-color LED configured to illuminate a certain color to indicate to the user the Wi-Fi connectivity status. The power cord 501 then exits the smart control housing 503 along with air tube 505a. In this way, the power cord 501 and air tube 505a can easily be coupled to one another via a connector, such as a cable tie/zip tie if desired, so as to maintain a clean looking configuration.

Figure 6:
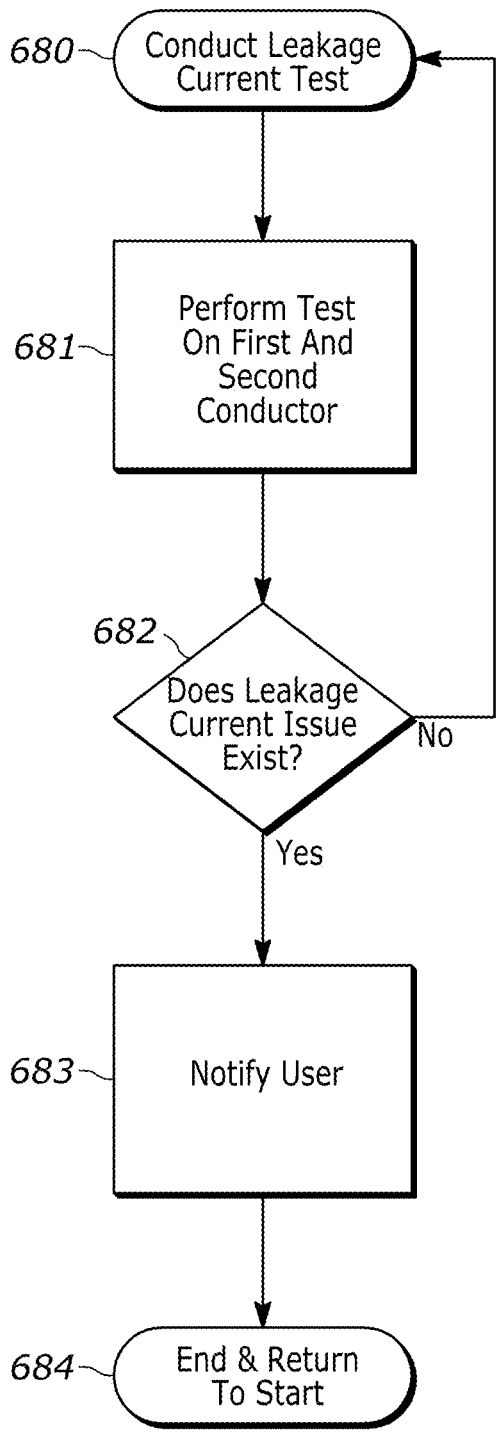
FIG. 6 is a flow chart illustrating an exemplary leakage current detection routine in accordance with aspects of the invention.
Figure 7:
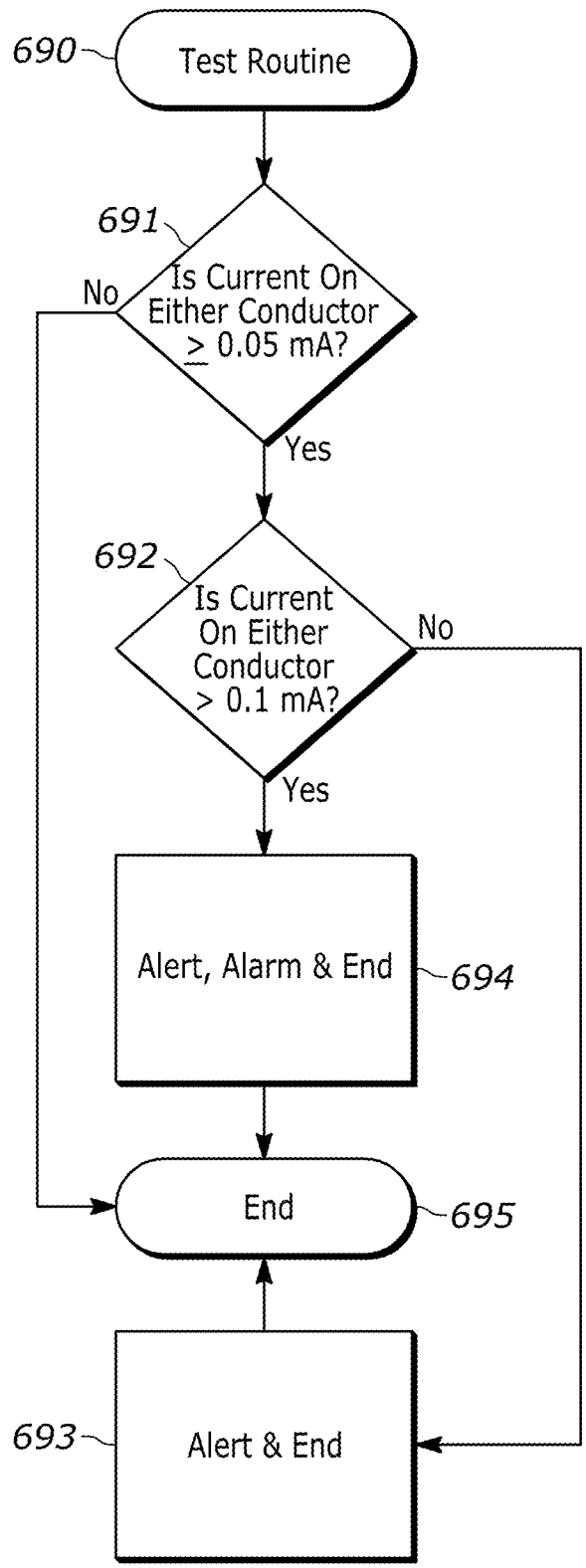
FIG. 7 is a flow chart illustrating an exemplary conductor test routine in accordance with aspects of the invention.

FIGS. 6 and 7 illustrate flow charts for a preferred form of operation of the smart controls illustrated herein. In FIG. 6, a leakage current test routine starts at step 680 and a leakage current test is performed on the first and second conductors (e.g., Line and Neutral wires) in step 681. In step 682, the routine asks if a leakage current issue exists. If not, the routine returns to start 680. If so, the routine alerts the user in step 683 and then ends in step 684 until the next leakage current test is to be conducted at which time the routine starts back over at step 680. In FIG. 7, an exemplary test sub-routine is shown that may be used by the routine of FIG. 6 to detect if a leakage current issue exists. In the subroutine of FIG. 7, the routine starts at step 690 and asks if the leakage current on either conductor tested is equal to or greater than 0.05 mA. If not, the routine ends at step 695. If so, however, the routine then checks to see if the leakage current detected on either conductor is greater than 0.1 mA. If not, the routine alerts the user in step 693 and ends via step 695. If it is greater than 0.1 mA, the routine not only alerts the user, but also actuates an alarm in step 694 as a more critical motor failure has been detected and ends in step 695. As mentioned above, these threshold figures of 0.05 mA and 0.1 mA are preferred for a pump application, but may be adjusted depending on the application the test is to be used for (e.g., thresholds may differ depending on type of motor being tested, type of product being tested, if higher or lower thresholds are desired for initiating alerts and/or alarms, etc.).

While the above embodiments show the smart control having power cords extending from opposite ends, it should be understood that in other embodiments, the smart control could alternatively have a power cord on one end and an electrical socket located elsewhere on the smart control housing that the power cord of an electric motor operated device would simply be plugged into in order to get the benefit of the smart control. In this way, the smart power cord would be more of an accessory for attaching to existing electric motor operated devices.

In some forms, the smart power cord would have numerous such electrical sockets that electrical devices can be plugged into so that it operates like a smart power strip capable of detecting early motor failure or critical motor failure issues for all devices plugged into the strip. The power strip would be able to detect when one of the electric motor operated devices plugged into it is exhibiting early or imminent motor failure conditions and notify the user of same so that the user can test the devices individually to determine which was exhibiting the motor failure condition detected. Alternatively, LEDs may be provided by each outlet to indicate which device/power cord has exhibited the early or imminent/urgent motor failure concerns.

Figure 8:
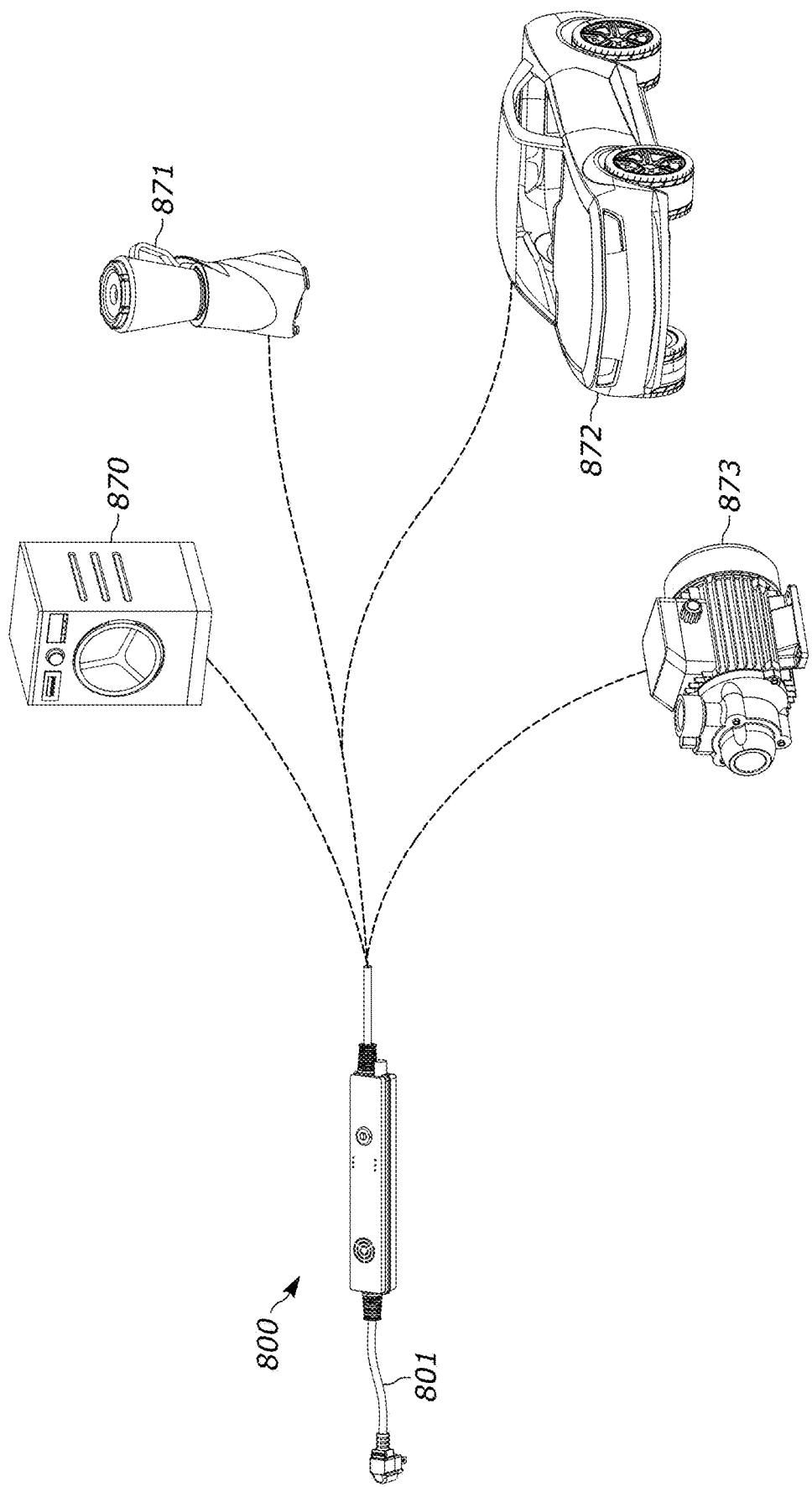
FIG. 8 illustrates exemplary uses for the smart power cord disclosed herein and illustrates how it may be used with any motor driven device.

As mentioned above, however, in alternate forms the smart control would simply be integrated into OEM products instead of being an accessory for same. As also mentioned above, the smart controller may be used with any type of electric motor operated device. For example, in FIG. 8 applications for such a smart control 800 with power cord 801 include numerous different appliances such as washers or dryers 870 or blenders 871, vehicles 872 (e.g., electric vehicles), and other pumps 873. Thus, it should be understood that any motor operated device that could benefit from such a leakage current detection to detect early or imminent motor failure is intended to be covered by the disclosure herein.

Figure 9A:
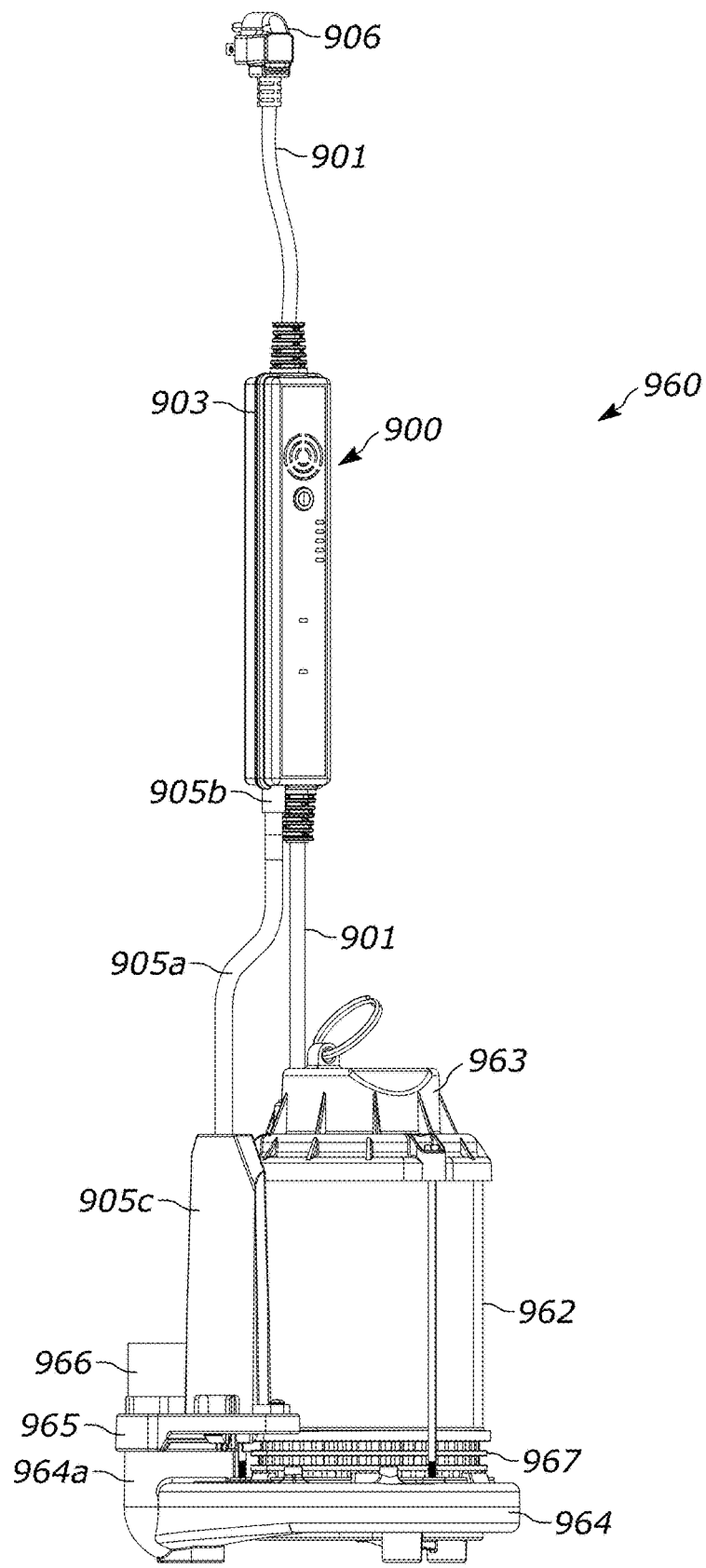
FIGS. 9A-C are front elevation, left-side elevation, and right-side elevation views, respectively, of an exemplary smart AC powered sump pump in accordance with aspects of the invention that utilize a leakage current detector and notifier.
Figure 9B:
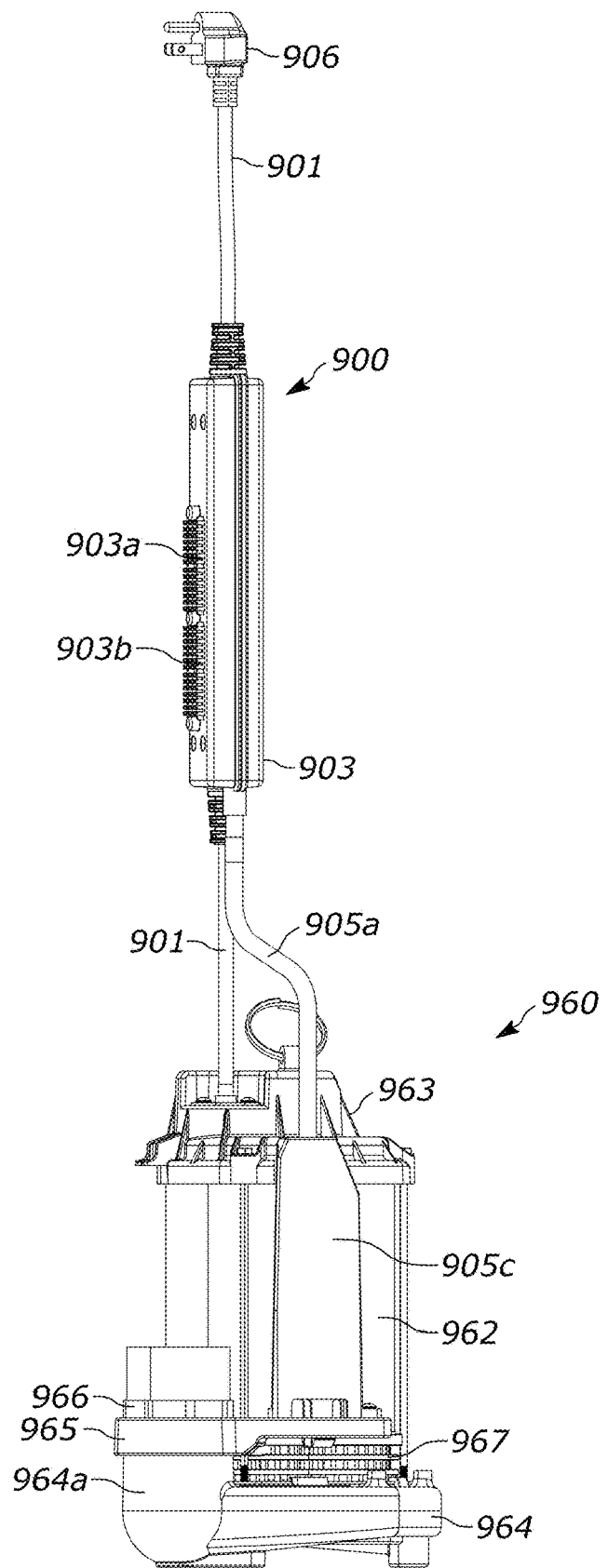
Figure 9C:
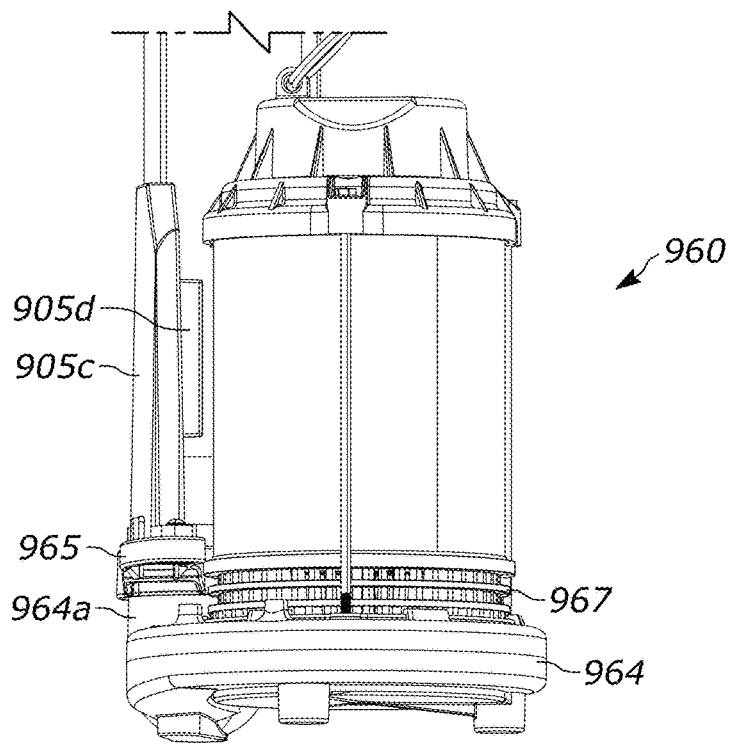

As an example of an original OEM product having a smart control integrated therein (rather than as an accessory capable of being connected and disconnected therefrom), FIGS. 9A-C illustrate a submersible pump having such a smart control. In keeping with prior practice, the same latter two-digit reference numerals will be used for items similar to those discussed above with the prefix 9. Thus, in these figures, the pump is referenced generally by reference numeral 960 and includes a motor housing 962, cap 963, water handler, such as volute 964, with a discharge outlet 964a having an air switch mount or bracket 965 for supporting an air switch housing 905c and an outlet coupling 966 to which a discharge pipe may be coupled. The pump 960 can be any type of pump as mentioned above and may be a top suction type pump, a bottom suction type pump or a combination of both as shown in Applicant's U.S. Patent Application Publication 2018/0128272, published, May 10, 2018, entitled Dual Inlet Volute, Impeller and Pump Housing for Same, and Related Methods, which is incorporated by reference herein in its entirety. The pump illustrated is a top suction pump with a filter 967 located above the volute 964. The motor is sealed in the housing 962 by epoxy resin and cap 963, however, it is these sealing features that can breakdown and lead to motor leakage current that ultimately leads to motor failure. Hence, by pairing pump 960 with a smart controller 900 affords the pump 960 the ability to provide early motor failure detection and even imminent motor failure warnings.

In the form shown, the power controller 900 is configured on the circuit of FIG. 2 and layout of FIGS. 5A-B and the air switch housing 905c is mounted to the pump 960 via a bracket that fits into the discharge 964a of water handler or volute 964. In a preferred form, the air switch housing 905c fastens to the mount or bracket 965 via depressible clips or hooks that can easily be squeezed together to release the housing 905c from mount or bracket 965 if desired such as for assembly, repair or replacement. The clips engage mating surfaces formed by recesses in the air housing mount or bracket 965 to secure the air switch housing 905c to the bracket 965. Coupling 966 has male threading that allows it to be inserted through an opening in the air housing mount or bracket 965 and threaded into mating female threading in outlet 964*a* of water handler/volute 964 to secure (e.g., sandwich or clamp) the air housing mount bracket 965 between the coupling 966 and outlet 964*a* of volute 964.

Figure 10:
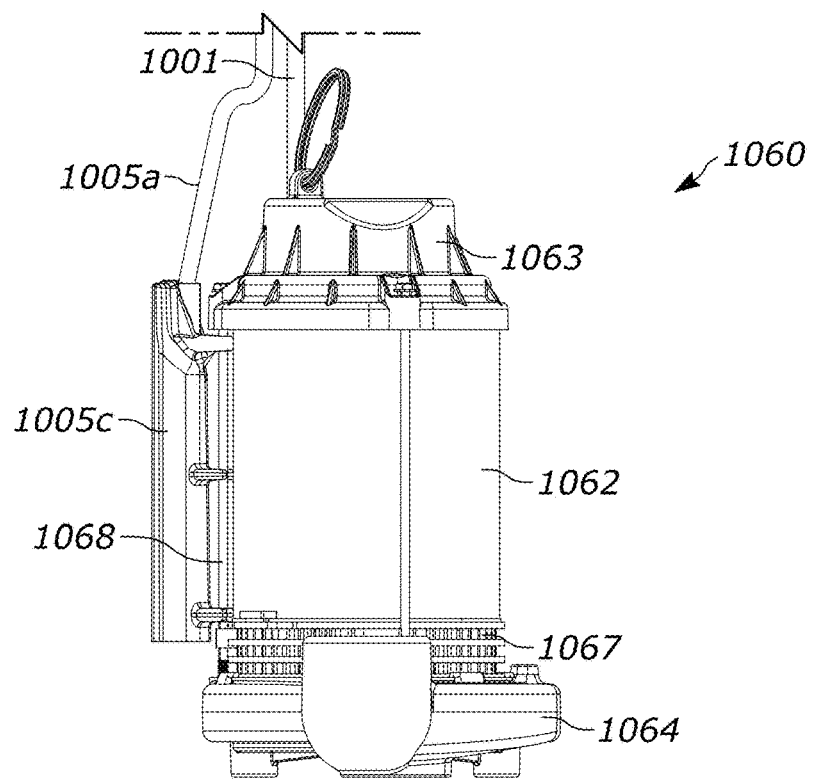
FIG. 10 is a right-side elevation view of an alternate smart AC powered sump pump similar to that shown in FIGS. 9A-C, but illustrating an alternate way in which the fluid level sensor housing may be mounted to the pump.

As best seen in FIG. 9C, the air switch housing further includes a spacer 905*d* that is used to ensure the air switch housing 905*c* will maintain adequate spacing from pump housing 962 regardless of what size pump and pump housing is used. In alternate embodiments, however, the air switch housing 905*c* may be connected to the pump in different manners. For example, in FIG. 10, an alternate pump is illustrated and referenced as 1060. In this embodiment, the pump includes a capacitive fluid level sensor where the sensor housing 1005*c* is connected to the pump 1060 via a fastener, such as one of the assembly bolts 1068 that is used to connect and secure the pump cap 1063, housing 1062, filter 1067 and volute 1064 together. In the form shown, the sensor housing 1005*c* has three protrusions or arms extending from the housing that define coaxial openings through with the motor assembly bolt 1068 to capture the air switch housing 1005*c* on the bolt 1068 and preferably between the motor cap 1063 and filter 1067. While the embodiment of FIG. 10 shows a capacitive fluid level sensor, it should be understood that in alternate embodiments a pneumatic pressure sensor could be mounted to the pump 1060 in a similar way, e.g., the air switch housing of the pneumatic pressure sensor could be similarly mounted to an exposed bolt 1068 of the pump housing 1062.

In the form shown in FIGS. 9A-C and as best seen in FIG. 9B, the smart controller 900 will preferably have additional heatsinks 903*a*, 903*b* that are visible on the exterior of housing 903 of the smart controller 900. These additional heatsinks allow the electronics located within housing 903 to further dissipate heat generated from the power circuitry and mainly the transformer and triacs on the PCB. In alternate forms, external heatsinks such as 903*a*, 903*b* may not be used, however, in the instant circuit they are in order to reduce heat associated with the product.

While the pump embodiments discussed up to now have been single pump systems, it should be understood that the smart controller disclosed herein may be used in multiple pump systems as well. For example, in FIG. 11 there is illustrated a battery back-up sump pump system. In keeping with practice, similar items in this figure will be marked with similar latter two-digit reference numerals and the prefix 11 will be added to distinguish this embodiment from others. As shown, the system includes a first smart AC pump 1160 having a smart controller 1100 and a battery backup DC pump 1169 that is powered by a battery 1174 when power is lost to the main AC pump 1160, such as due to a power outage, tripped breaker/fuse or ground fault circuit interrupter (GFCI) or ground fault interrupter (GFI) (also known as a residual-current device (RCD) or residual-current circuit breaker (RCCB)).

In the form shown, battery 1174 is a smart battery such as a Lithium Ion battery (Li-ion battery) with a wireless communication circuit capable of communicating with smart control 1100 of AC pump 1160. In a preferred form, the wireless communication technique used is Bluetooth (BT) communication, but in alternate forms it may be any other communication technique like those discussed above (e.g., radio frequency (RF), Bluetooth low energy (BLE), near field communication (NFC), Wi-Fi, cellular, or other communication technique used by Internet of Things (IoT) devices, etc.). In this way, the smart battery 1174 is capable of communicating to smart controller 1100 pertinent information relating to the smart battery to alert the user to any anomaly detected with same and vice versa (smart control 1100 is capable of communicating its data back to smart battery 1174). For example, the smart battery 1160 is capable of communicating to smart control 1100 information regarding the battery's voltage, amperage, state of battery health or state of health (SOH), state of battery charge or state of charge (SOC), etc., so that this information may be conveyed to the user via the app used in connection with the smart control 1100. Thus, during normal operation (e.g., not a power outage or the like) the smart control 1100 can not only relay information to the user regarding smart AC pump 1160, but also relating to the battery back-up system.

In some forms, the smart control 1100 may have its own internal battery to power itself even during a power outage so that it can continue to provide information relating to the pump system or sump 1161. In such instances, the smart control 1100 could convey the information back to the smart battery 1174 and allow the smart battery 1174 to relay that information to the user via the app due to the ability of the back-up system to run off the battery power of smart battery 1174.

Figure 11:
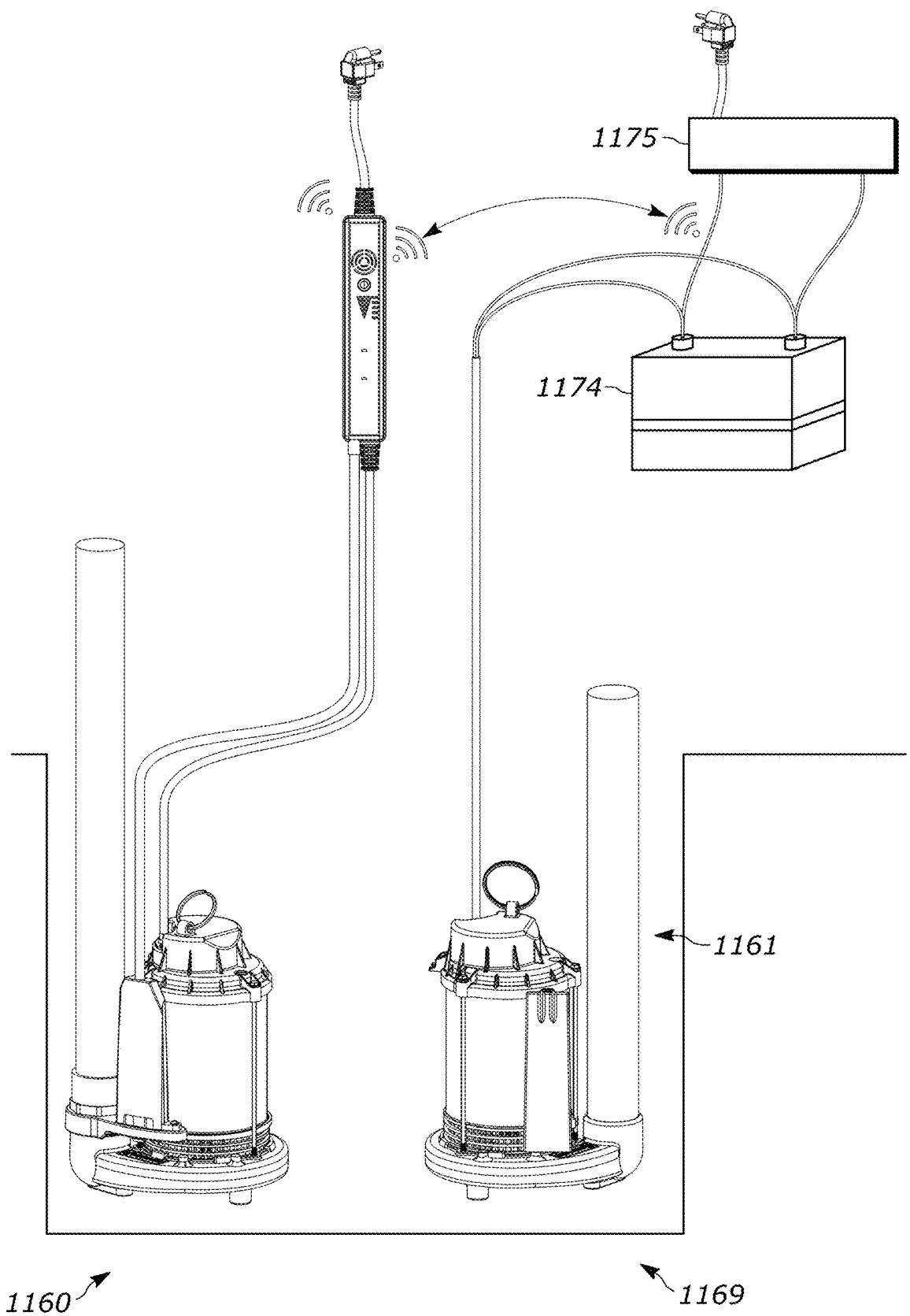
FIG. 11 is a front perspective view of an alternate battery back-up pump system utilizing the smart AC pump and smart power cord (or smart controller) disclosed herein along with a battery back-up DC pump, and illustrating a wireless communication interface between the smart controller and a smart battery.

One benefit to the setup illustrated in FIG. 11 is that a simple battery charger 1175 may be used with the system instead of needing something more complex (more expensive, more energy consuming, etc.). Another benefit is that Li-ion batteries are very easy to monitor in this way and, thus, would be preferred for such applications. However, it should be understood that in alternate embodiments, the battery charger could be battery backed-up smart charger as well and capable of communicating with any one or more of the AC pump 1160, DC pump 1169 and/or battery 1174. In some embodiments, all the system components (e.g., AC pump/smart controller, DC pump, battery and battery charger) may be smart, however, that would be for a very high-end system. Normally, it would be preferred to have smart controller 1100 and only one of the battery 1174 or battery charger 1175 be "smart" as well (or equipped with reporting/communication capabilities) in order to keep the cost down and of those, it would make most sense to have the smart battery as the battery charger is not an essential component and would simply use-up more battery that could otherwise be focused on the operation of the DC pump 1169.

In the above pump examples, the pumps include a fluid level detector to control the pumping of fluid by the system. The fluid level detector monitors the level of the fluid. When the fluid rises to or beyond a predetermined level, the fluid level detector is configured to detect the rise in fluid and cause the power cord accessory 100 to turn on and/or deliver power to the pump motor. The fluid level detector may be a pneumatic pressure tube or switch. More details of such a switch may be found in Applicant's U.S. Patent Application Publication Nos. 2017/0175746, published Jun. 22, 2017, entitled Integrated Sump Pump Controller With Status Notifications; and 2018/0163730, published Jun. 14, 2018, entitled Pump Communication Module, Pump System Using Same and Methods Relating Thereto, which are hereby incorporated by reference in their entirety. In the forms shown, a tube may be connected to the transducer and pass through the air tube receiver and down into a sump pit. Use of a pneumatic pressure switch reduces (if not eliminates) the number of moving mechanical parts, which can result in an increase in system reliability. The pressure tube has a pressure tube inlet, and is connected to a switch device (e.g., the transducer), which may be contained within the smart controller as shown previously.

Such systems may evoke additional steps to ensure that the air tube is back to atmospheric pressure. For example, the pneumatic pressure switch system can be configured to flush air after a predetermined period to recalibrate and eliminate problems with condensation build-up or tube leakage. The pneumatic pressure fluid level detection system may alternatively employ sensors that are adapted to operate so that the water level is held below an opening. In this manner the fluid level in the sump pit maintains a certain level with respect to the fluid level in the tube (e.g., the pit and tube fluid levels do not have to be equal or level with one another, but rather simply correlate with one another so that the level in the tube can be used to calculate a corresponding level of fluid within the pit). Further, in some examples, the systems will be configured to turn on after a predetermined time so that the air in the tube returns to atmospheric pressure. In a preferred form, the system will be configured to detect when the pressure reading from the air switch indicates a high fluid level has been reached, will operate the pump to draw fluid down and then will stop the pump once a substantially constant pressure reading has been reached as that will mean the air switch has returned to atmospheric pressure. The reason a particular pressure value is not looked for in determining when to stop the pump but rather a constant pressure is that looking for a particular pressure value would require the pump to be calibrated (possibly often) and would require knowledge of where the pump will be used or in what type of application as the particular pressure value might be different based on elevation or application (e.g., is it used on a regular sump pump application, is it being used in a sealed radon sump system, etc.). By not requiring a specific or particular pressure value to be looked for and rather just a generally or substantially constant pressure value to be seen, the system does not have to worry about these other details/factors and simply knows this means to shut the pump off when this condition is detected.

In still other forms, a solid state fluid level switch may be used such as those disclosed in Applicant's U.S. Pat. No. 8,380,355, U.S. Patent Application Publication No. 2013/0156605, published Jun. 20, 2013, entitled Capacitive Sensor and Method and Apparatus for Controlling a Pump Using Same, and U.S. application Ser. No. 13/768,899 (Mayleben et. al.), which are hereby incorporated by reference in their entirety.

While various example pump embodiments have been disclosed, it should be understood that the disclosed subject matter may be broadly applied to other forms of pumps, for example, single flow or discharge utility pumps, well pumps, lawn pumps, sewage pumps, pool pumps, etc. For example, pumps such as Applicant's utility pumps illustrated in U.S. Patent Application Publication Nos. 2017/0030371, published Feb. 2, 2017, entitled Multi-Outlet Utility Pump, and 2019/0048875, published Feb. 14, 2019, entitled Thermally Controlled Utility Pump and Methods Relating to Same, which are incorporated herein by reference in their entirety.

Again, while a pump has been primarily used as an example application for the disclosed invention, it should not be assumed that the disclosure is limited to submersible pump applications, but rather can be broadly applied to any motor driven device. The above principles may be used to detect when motor driven machinery will fail or that it exhibits signs indicating a failure will occur in the near future or that failure is imminent. The machinery may be plugged into a power cord accessory which is plugged into the wall outlet or a power strip with such technology. Alternatively, the machinery may be built to include a leakage current detector and notifier discussed in this disclosure within the machinery. In either example, the leakage current detector tests the machinery's motor before the motor is run. The leakage current detector determines if any leakage current exists and to what extent. If the leakage current falls within the range that indicates any type of failure condition is present, then the notifier of the machinery or the power cord accessory will alert the machinery operator of this failure condition, so they may be aware that the machinery may fail, allowing the operator to take appropriate action. The machinery may include a warning system that the notifier circuit communicates with to alert or notify the operator or machinery supervisor that a machinery failure condition has been detected.

Figure 12:
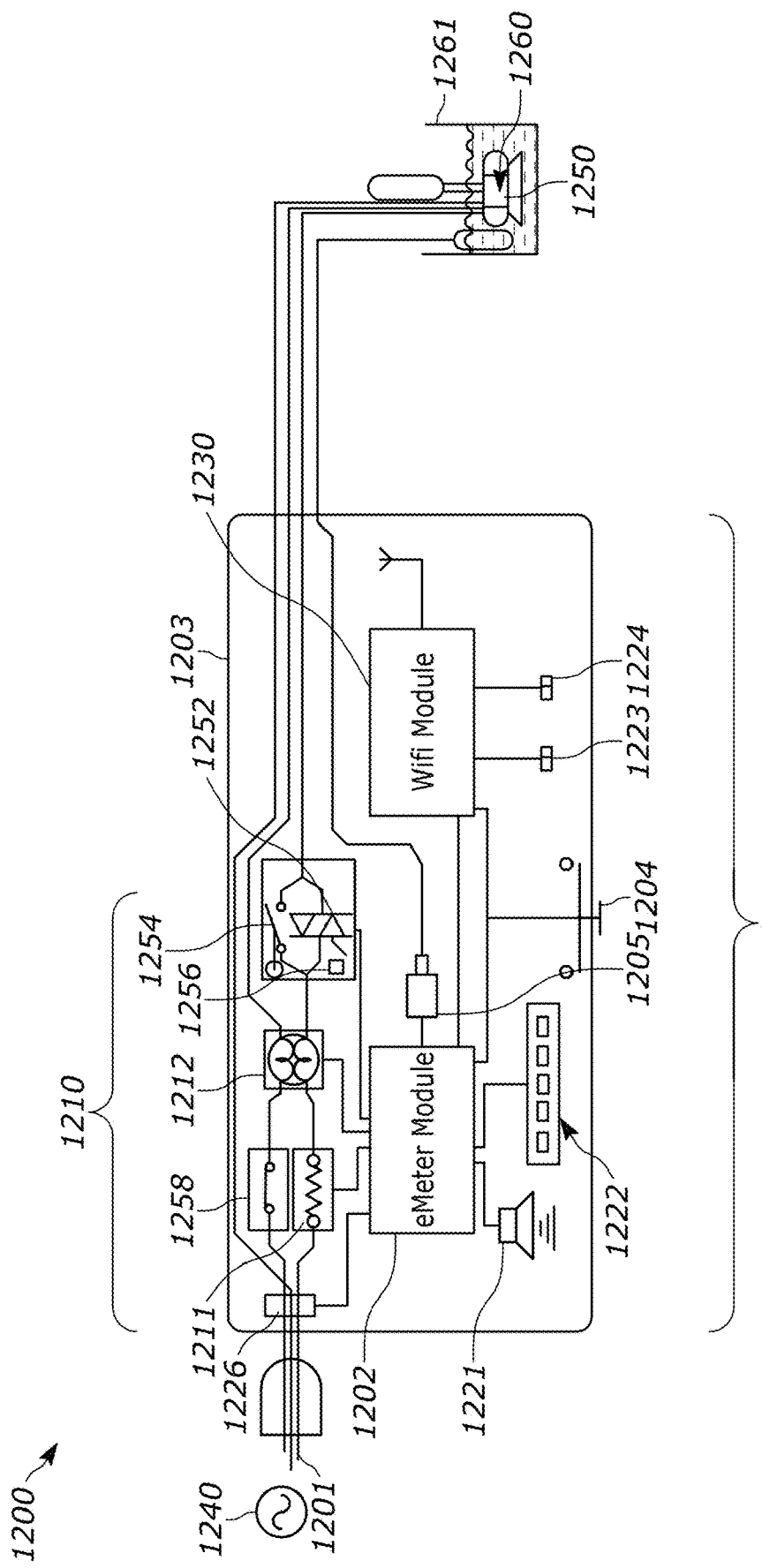
FIG. 12 is an exemplary circuit diagram for a leakage detector of an alternate configuration used in connection with a pump.

In an alternative embodiment, a smart control including circuitry as illustrated in FIG. 12 may be used. The smart control 1200 of this embodiment is similar to the smart control 200 discussed above in regard to FIG. 2, the differences of which are highlighted in the following description. In keeping with prior practice, items that are similar to those discussed above will use the same latter two-digit reference numeral but begin with the prefix 12 to distinguish this embodiment from other embodiments. Thus, in FIG. 12, the smart control is referenced generally by reference numeral 1200 which is connected between power supply 1240 and motor 1250. In this embodiment, the smart control 1200 includes an AC switch, such as triac 1252, in parallel with a normally open relay on the Line wire after the transformer 1212. The triac 1252 may be controlled by the controller 1202 to provide power the pump 1260 when the controller 1202 determines that the pump 1260 must be run, for example, when the water level within the sump pit 1261 is above a threshold. Since the pump 1260 often will only operate for a few seconds at a time, the heat generated by the triac 1252 that delivers power to the pump 1260 is able to be dissipated without the need for a heat sink attached to the triac 1252. In a preferred form, triac 1252 will be an optotriac or solid-state relay (SSR) which allows a low-power DC control circuit to switch on AC power to an AC device like pump 1260 while preventing the low-power DC components from being exposed to the AC power and without the need for a more expensive transformer.

In situations where the pump 1260 needs to run for a longer period of time, the triac 1252 may generate too much heat to be adequately dissipated between run cycles. Instead of using a large and/or expensive heat sink to aid in heat dissipation for these situations, the smart control 1200 of this embodiment includes a relay 1254 in parallel with the triac 1252. The controller 1202 may be in communication with a temperature sensor 1256 that monitors the temperature of the triac 1252. When the temperature of the triac 1252 is above a threshold temperature (e.g., 60 degrees Celsius) and/or the triac 1252 is powered on by the controller 1202 for a certain period of time, the controller 1202 may turn off the triac 1252 and close the normally open relay 1254. Power is then supplied to the pump 1260 via the relay 1254 while the triac 1252 is off, thus allowing the triac 1252 to cool.

In some forms, rather than turning off the triac 1252, the controller 1202 simply closes the relay 1254 with the triac 1252 still on. This reduces the heat generated by the triac 1252 while allowing the triac 1252 to serve as the main conduit for powering the pump 1260. This reduces the burden on the relay 1254 as power (e.g., 120 VAC) is provided to the pump 1260 via the both the relay 1254 and the triac 1252. This aids in increasing the life of the relay 1254. In still other forms, however, the relay provides a path of least resistance and, thus, the current passes through the relay rather than the triac 1252 because of the resistance associated with the triac 1252. This still offers significant benefits, however, in that the relay 1254 is not exposed to direct line voltage at start-up, but rather a reduced start-up voltage associated with the internal resistance of the triac 1252. Thus, the relay 1254 is turned-on or activated much more gradually than if it was exposed to direct alternating current ("AC") line voltage at start-up. This protects the relay and prolongs the life by not exposing it to the higher start-up line voltage it would otherwise be exposed to but for the triac. For example, the more gradual or manageable start-up prevents damage to the relay such as pitting that can cause relays to die earlier than their desired life expectancy.

In another form, the controller 1202 turns on the triac 1252 to power the pump 1260 and then shortly after, closes the relay 1254 to provide power to the pump 1260. For instance, where the triac 1252 is above a certain temperature (e.g., 60 degrees Celsius) and the controller 1202 determines that the pump 1260 must be powered, the controller 1202 may first turn on the triac 1252 to provide power to the motor of the pump 1260 and after a certain period of time (e.g., 20 ms) close the relay 1254. Under this approach, the triac 1252 bears the brunt of the 120 VAC power that is used to turn on the motor 1250 of the pump 1260. Then the relay 1254 may be closed, which, being connected in parallel to the triac 1252, aids in providing the power to the pump 1260 and reduces the amount of heat generated by the triac 1252. Turning the relay 1254 on after the triac 1252 initially powers the pump 1260 aids in reducing the wear placed on the relay 1254 (e.g., pitting of the relay contact, extreme relay parameter operation, etc.) that would occur under the high current draw associated with initially powering the pump 1260 and specifically motor 1250.

Providing a relay 1254 in parallel with the triac 1252 also adds redundancy into the smart control 1200. For instance, if the triac 1252 should fail, the controller 1202 may use the relay 1254 to deliver power to the pump 1260. Thus, even if the triac 1252 fails, the pump 1260 may be operated via the relay 1254. The smart control 1200 may be configured to provide an error signal or notification indicating that the triac 1252 of the smart control 1200 has failed and that the smart control 1200 is in need of maintenance or replacement while still allowing the unit to operate in the meantime (e.g., if not a full redundant operation, at least a limp-home feature that provides for some operability). The opposite is true as well in that the triac 1252 provides redundancy for the relay 1254. Thus, if the relay fails, the triac will continue to allow the system to operate, however, it may have to shutdown from time to time if heat build-up becomes a problem since the relay is no longer available to help address that issue. In practice, the relay 1254 will not be needed until the pump has been running for an excessive period of time. In some forms this may be greater than ten seconds (10s), however, in other forms it may be a lower threshold such as six seconds (6s).

In view of the above, it should be understood that numerous apparatus, systems and methods are disclosed herein. For example, in some forms, apparatus, systems and methods are disclosed for detecting motor leakage current indicative of a failing motor so that early warning of this situation may be provided without a pump owner or user experiencing failure that might otherwise lead to further damage (e.g., flooding of an area, the cessation of a motor driven device during a critical time of operations, etc.). In a preferred form, the apparatus, systems and methods disclosed herein will alert the user to the problem with sufficient time to address same before it becomes a bigger problem. In this regard, one form of the apparatus, systems and methods disclosed herein involves monitoring leakage current to ground without needing the motor to be operated (or turned on) so that the line and neutral wires can be checked for leaking to ground and alerting the user to that situation when it is detected well in advance of motor failure. In some forms, the apparatus, system and methods can alert the user when the polarity of the outlet the motor is connected to is wired incorrectly (or the polarity the motor is exposed to is incorrect). In some forms the apparatus, system and method will alert the user to the improper polarity, such as by way of an audible alert and/or a visual alert (e.g., a buzzer, an illuminated light, etc.). In a preferred form, the alert will be provided via a message sent to the user's mobile device alerting him/her to the early failure detection prior to it becoming a more serious issue.

In other forms, the apparatus, systems and methods disclosed herein address heat issues circuitry may be exposed to due to operation of the motor driven device. For example, in one form, an AC switch is used to allow the motor driven device to operate off conventional AC line voltage or power. Such switches can be exposed to excessive heat generation that can cause protective components or circuitry like thermal cutoffs (TCOs) to kick in to prevent the circuitry or motor driven device from overheating. For example, in the sump pump embodiment disclosed above, a triac is used to serve as the AC switch. The triac is capable of operating the pump for a reasonable period of time without generating excessive heat (e.g., six seconds, ten seconds, etc.). When excessive heat is generated, the apparatus, system and method disclosed herein could simply use a thermal cutoff or TSO switch to shutdown the motor driven device, however, in a preferred form, the circuit will include a relay in parallel to the AC switch to allow the relay to close such that it diverts (or largely diverts) the current and power from the triac to the relay to allow the triac to cool. This configuration allows the heat generation issue associated with the triac to be addressed while also allowing the relay to be powered-up or started more gently by not exposing it to the brunt of the AC line voltage at start-up and instead subjecting it only to the much lower start-up voltage associated with the resistive drop over the triac. This protects and prolongs the life of the relay by preventing it from the damage or wear and tear that a relay normally sees when exposed directly to AC line voltage (e.g., pitting, relay contact and/or terminal damage, etc.). Thus the circuit has a first switch in combination with a second switch wired generally in parallel with the first switch so that the second switch may be used to address heat issues associate with the first switch when necessary, and doing so in a way that protects or prolongs the life of the second switch during its operation. The terms first and second switch may be used generically to refer to either the triac or relay. In some forms discussed herein, the triac is simply called-out as the triac with the relay being referred to as the first switch wired in parallel with the triac to takeover operation of the powering of the motor driven device when the triac needs a break due to heat build-up.

What is claimed is:
1. A pump comprising:
   a fluid inlet;
   a fluid outlet;
   an electric motor operable to pump fluid from the fluid inlet toward the fluid outlet;
   one or more power conductors to provide electrical power to the electric motor from a power source; and a leakage current detector having a current transformer operably connected to the one or more power conductors and a leakage current detection circuit connected to the current transformer, the leakage current detection circuit configured to:
- detect leakage current flowing in the one or more power conductors using the current transformer without operating the electric motor; and
- output a signal to provide notice of a problem with the pump based at least in part on the detected leakage current.

2. The pump of claim 1 wherein the current transformer includes at least one primary winding connected to a Line conductor and/or a Neutral conductor of the one or more power conductors and a secondary winding coupled to the at least one primary winding to detect leakage current through the Line conductor and/or Neutral conductor.

3. The pump of claim 2 wherein the secondary winding of the current transformer is electrically connected to the leakage current detection circuit.

4. The pump of claim 2 wherein the at least one primary winding includes a first primary winding connected to the Line conductor and a second primary winding connected to the Neutral conductor.

5. The pump of claim 1 wherein the leakage current detection circuit is configured to output the signal when detected leakage current exceeds a predetermined threshold.

6. The pump of claim 5 wherein the predetermined threshold is 0.05 mA.

7. The pump of claim 1 wherein to output the signal includes outputting an alert signal when leakage current indicates an advance motor failure condition exists and outputting an alarm signal when an imminent motor failure condition exists.

8. The pump of claim 7 wherein the alert signal is output when the detected leakage current is between about 0.05 mA and 6 mA and wherein the alarm signal is output when the detected leakage current is above 6 mA.

9. The pump of claim 1 wherein the leakage current detector further includes:
- a first switch operable to permit current to flow through a Line conductor of the one or more power conductors relative to the electric motor; and
- a second switch operable to permit current to flow through a Neutral conductor of the one or more power conductors relative to the electric motor,
wherein to operate the electric motor both the first switch and the second switch are closed and to detect leakage current without operating the electric motor includes the leakage current detection circuit causing one of the first switch and the second switch to be open and the other of the first switch and the second switch to be closed.

10. The pump of claim 9 wherein the first switch comprises a relay switch in parallel with a triac, wherein the at least one of the relay switch and the triac are operable to permit current to flow through the Line conductor relative to the electric motor.

11. The pump of claim 1 further comprising a fluid level sensor to detect a fluid level, wherein the electric motor is operated when the detected fluid level exceeds a predetermined threshold.

12. The pump of claim 1 wherein to output the signal includes wirelessly transmitting a message to a user advising when the detected leakage current exceeds a predetermined threshold.

13. The pump of claim 1 wherein the leakage current detection circuit is further configured to inhibit operation of the motor when the detected leakage current exceeds a predetermined threshold.

14. The pump of claim 13 wherein the predetermined threshold is 6 mA.

15. A pump system comprising:
- a DC pump including a battery and communication circuitry;
- an AC pump including:
  - an electric motor;
  - a leakage current detector configured to detect leakage current in the electric motor; and
  - communication circuitry configured to wirelessly communicate with the DC pump.

16. The pump system of claim 15 wherein at least one of the DC pump and the AC pump are configured to wirelessly transmit information relating to the pump system to a remote device of a user.

17. The pump system of claim 16 wherein the at least one of the DC pump and the AC pump are configured to communicate via at least one of wireless fidelity (Wi-Fi), Cellular, radio frequency (RF), infrared (IR), Bluetooth (BT), Bluetooth Low Energy (BLE), Zigbee and near field communication (NFC).

18. The pump system of claim 15 wherein the DC pump includes a battery charger configured to be connected to an AC power source and operable to charge the battery.

19. The pump system of claim 15 wherein the DC pump operates using electric power of the battery when AC power is unavailable to the AC pump.

* * * * *